United States Patent [19]
Nagashima

[11] Patent Number: 5,824,360
[45] Date of Patent: Oct. 20, 1998

[54] METHOD OF PLANARIZING FILM IN SEMICONDUCTOR DEVICE

[75] Inventor: Naoki Nagashima, Kanagawa, Japan

[73] Assignee: Sony Corporation, Japan

[21] Appl. No.: 695,305

[22] Filed: Aug. 9, 1996

[30] Foreign Application Priority Data

Aug. 15, 1995 [JP] Japan ..................................... 7-229711

[51] Int. Cl.⁶ ...................................................... B05D 5/12
[52] U.S. Cl. ...................... 427/126.2; 427/344; 427/369; 427/419.2; 427/419.6; 427/419.3
[58] Field of Search .......................... 427/58, 369, 419.2, 427/419.3, 344, 126.2, 419.6

[56] References Cited

U.S. PATENT DOCUMENTS 4,313,773   2/1982   Briska et al. ............................ 427/344

FOREIGN PATENT DOCUMENTS 59-136943   8/1984   Japan .

Primary Examiner—Janyce Bell
Attorney, Agent, or Firm—Ronald P. Kananen

[57] ABSTRACT

A method of planarizing films in a semiconductor device, which is capable of uniformly planarizing films at a good controllability in polished amounts while keeping uniformity in polishing within a wafer surface. The method includes the steps of forming a first film on at least a step portion provided on a base body, covering the step portion with a second film containing phosphorus in an amount of from 6 to 9 wt % and higher in polishing rate than the first film, and polishing the second film to expose the first film formed on the top of the step portion.

23 Claims, 24 Drawing Sheets

[STEP-100]

[STEP-110]

[STEP-120]

[STEP-130]

[STEP-100A]

[STEP-120A]

[STEP-130A]

[STEP-200]

[STEP-210]

[STEP-220]

[STEP-230]

[STEP-400]

[STEP-410]

[STEP-420]

[STEP-500]

[STEP-520]

[STEP-530]

[STEP-540]

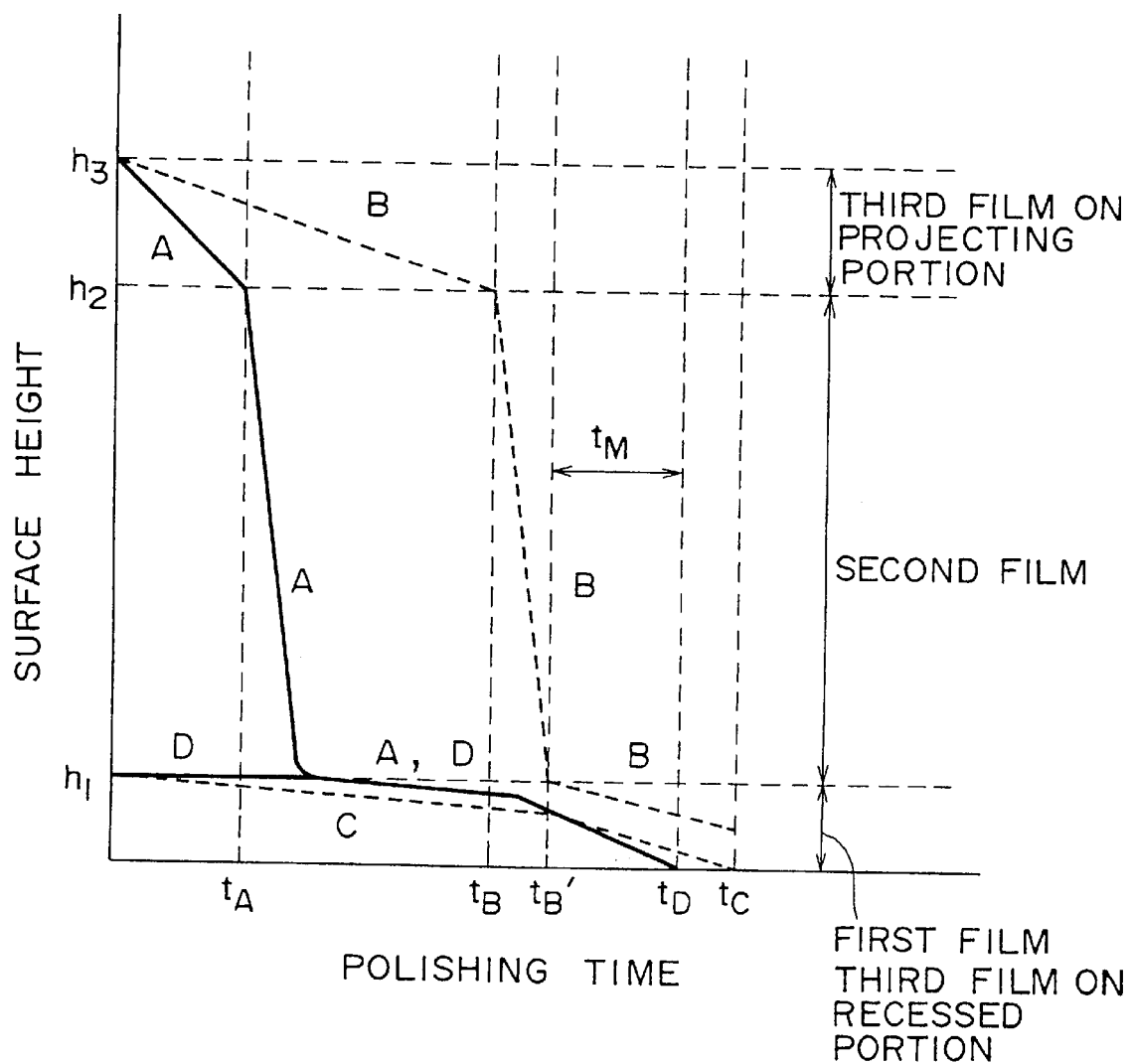
F I G. 10

[STEP-500A]

[STEP-530A]

[STEP-540A]

[STEP-600]

[STEP-610]

[STEP-620]

[STEP-630]

[STEP-640]

[STEP-650]

F I G. 14A
[STEP-700]
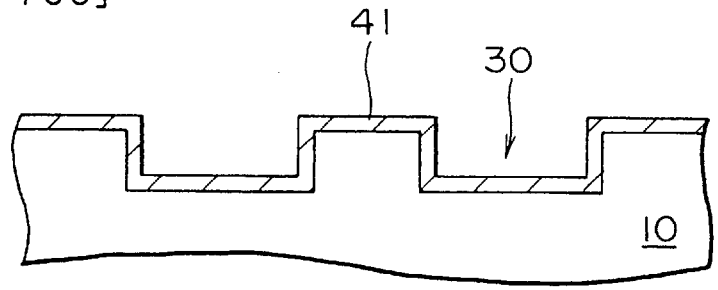
F I G. 14B
[STEP-710]
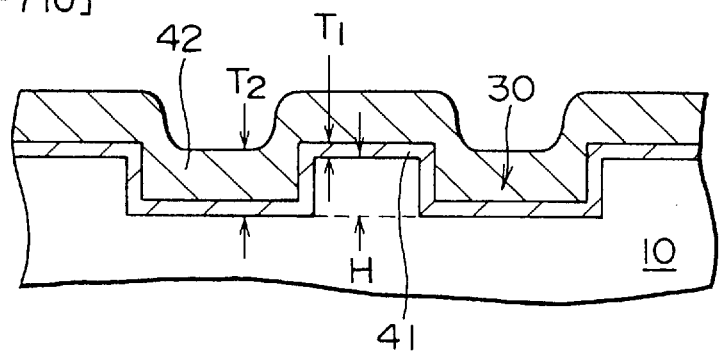
F I G. 14C
[STEP-720]
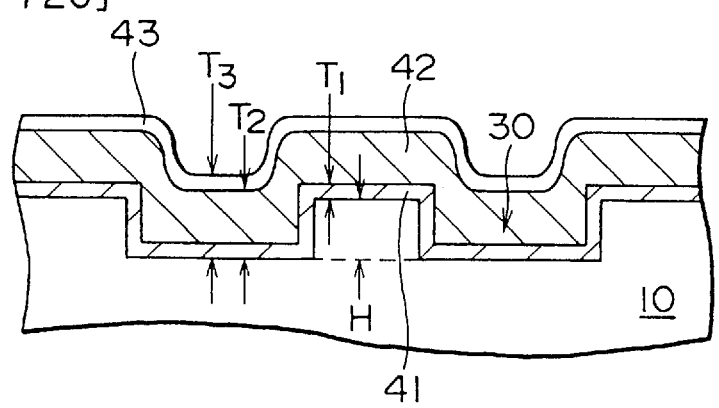

[STEP-730]

[STEP-740]

[STEP-800]

[STEP-810]

[STEP-820]

[STEP-830]

[STEP-840]

[STEP-900]

[STEP-910]

[STEP-930]

[STEP-940]

[STEP-950A]

[STEP-950B]

[STEP-1040]

[STEP-1050]

[STEP-1060]

F I G. 22A
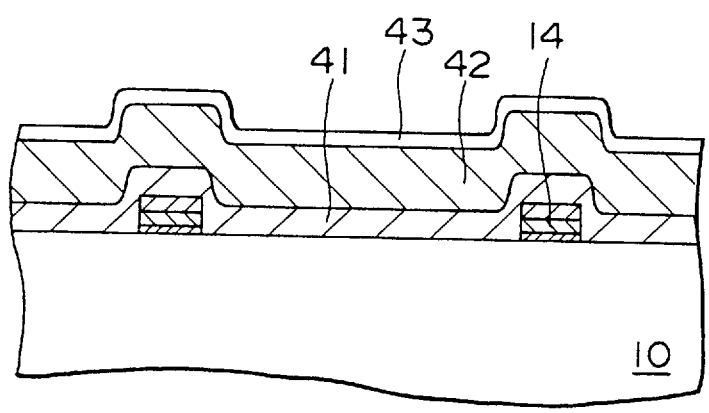
F I G. 22B
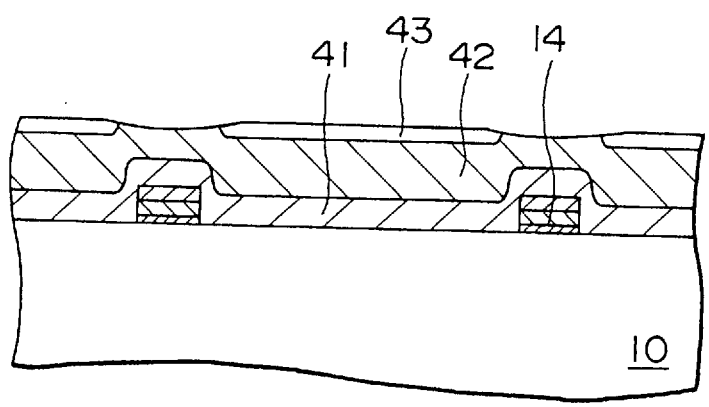

METHOD OF PLANARIZING FILM IN SEMICONDUCTOR DEVICE

BACKGROUND OF THE INVENTION

The present invention relates to a method of planarizing films in a semiconductor device, which is suitable for planarization of interlayer insulating films, trench type element isolation regions and the like in a process for fabricating a semiconductor device.

In fabrication of a semiconductor device, it is essential to form element isolation regions having an LOCOS structure and interconnections on a semiconductor substrate, to form interconnections on an element isolation region, and to form interconnections on an interlayer insulating film formed on a semiconductor substrate. In this case, large irregularities due to interconnections and element isolation regions are formed on the surface of a semiconductor substrate on which interconnections, interlayer insulating films formed with interconnections, element isolation regions having an LOCOS structure, or interconnections formed on element isolation regions having an LOCOS structure are formed. Hereinafter, such a semiconductor substrate on which inteterconnections and the like are formed is generally called a semi-finished semiconductor device. As a result, heights of the surface of the semi-finished semiconductor device are locally varied, that is, they are not flattened.

Shortening wavelengths of exposure light used for photolithography progresses with the trend toward finer geometries of semiconductor integrated circuits. The focal depth for exposure is proportional to the inverse number of a wavelength of exposure light, and accordingly, the focal depth for exposure in a projection optical system tends to be shortened. When a photoresist is applied on the surface of a semi-finished semiconductor device having large irregularities and is exposed to light, the position of the photoresist projected from the projection optical system is out of the optimum focal depth of the projection optical system. This presents a problem in which a line width of a photoresist pattern formed on the semi-finished semiconductor device by exposure and development of the photoresist locally varies on the semi-finished semiconductor device, or in which the photoresist pattern is not formed in a desired shape.

The film thickness of an interconnection layer formed on a large irregular surface of an interlayer insulating layer is locally varied. When such an interconnection layer is patterned into a desired shape, there occurs a disadvantage in that an interconnection formed of a thin portion of the interconnection layer is very thin and is thus less able to withstand voltage.

Various technologies for suppressing the formation of irregularities on the surface of a semi-finished semiconductor device have been examined: for example, a reflow process for borophosphosilicate glass (BPSG); a process of deposition and etch-back of an insulating film; a smoothing process using SOG (Spin On Glass); a planarization process by positive etching for projections on the surface; and a planarization process by polishing.

Hereinafter, the planarization process by polishing will be briefly described with reference to a process sequence shown in FIGS. 23A to 23D. Generally, in this context, polishing involves the removal of undesired surface irregularities using mechanical and/or chemical processes.

As shown in FIG. 23A, interconnections 114 are formed on the surface of a semiconductor substrate 110. An insulating layer 121 made of silicon oxide is formed or, the semiconductor substrate 110 by CVD (see FIG. 23B). The upper side of the insulating layer 121 is polished as shown in FIG. 23C, to planarize the surface of the insulating layer 121.

On the other hand, an LOCOS process has been used for formation of element isolation regions of a semiconductor device. In this process, element isolation regions made of silicon oxide are formed on a silicon substrate by selective thermal oxidation of the silicon substrate using a silicon nitride film as a mask. This process, however, is disadvantageous in that there occurs a so-called bird's beak upon thermal oxidation, in which an oxide film is protruded in a silicon nitride film from the edge thereof in the lateral direction of the silicon substrate. The bird's beak causes a transfer difference in dimension between a designed mask and an actual element isolation region pattern, and consequently the LOCOS process is difficult to apply in view of the trend toward finer-geometries and increased capacity of semiconducting elements.

To cope with such a disadvantage, there has been proposed a so-called trench type element isolation region formation process in which trenches provided in a semiconductor substrate by reactive ion etching are buried with an insulating film. In this process, after formation of trenches in the semiconductor substrate, an insulating film is deposited over the entire surface of the semiconductor substrate including the interiors of the trenches, and then the insulating film is etched-back by reactive ion etching to expose the surface of the semiconductor substrate again while leaving the insulating film in the trenches. Semiconducting elements are formed on the exposed portions of the semiconductor substrate.

The most important problem in the related art trench type element isolation region formation process is planarization of an insulating film. Specifically, in this process based on etch-back, when an insulating film deposited over the entire surface of a semiconductor substrate is etched-back, it is not left in a wide width trench for forming a wide field region, and thereby in this case, the LOCOS process must be used in combination. In other words, an element isolation region is formed in a narrow width trench by the trench type element isolation region formation process, while an element isolation region (wide field region) is formed in a wide width trench by the LOCOS process. The element isolation region formation method using the trench type element isolation region formation process in combination with the LOCOS process is long and complicated, requiring far too many steps, and consequently it is not suitable for mass-production of semiconductor devices.

On the other hand, the planarization process by chemical-mechanical polishing (CMP) or mechanical polishing is advantageous in that the amount of an insulating film remaining in a trench is not dependent on the area of the trench in which an element isolation region is formed and all of element isolation regions can be formed only by the trench type element isolation region formation process. The trench type element isolation region formation process using a polishing process such as CMP can form a wide element isolation region (wide field region) having a width of from 10 $\mu$m to 1000 $\mu$m, thereby making it possible to significantly reduce the number of steps in the process of forming element isolation regions. Thus, the CMP or the mechanical polishing is a remarkable present-day technology for the trench type element isolation region formation process, which is particularly excellent in productivity.

The above-described BPSG reflow process, insulating film deposition/etch-back process or SOG smoothing process, however, makes smooth only local irregularities on the surface of a semi-finished semiconductor device, and therefore, it fails to basically solve the problem of photolithography. On the other hand, the above-described planarizing process for planarizing the surface of a semi-finished semiconductor device by positively etching projections on the surface has a disadvantage in that the etching amount must be adjusted and the number of steps is increased.

The planarization process by polishing in which irregularities on the surface of a semi-finished semiconductor device are planarized by polishing is disadvantageous in that when the insulating layer 121 in FIGS. 23A to 23D is polished, the polishing rate and the polished amount of the insulating layer 121 at each area within one wafer surface (hereinafter, referred to simply as "within a wafer surface") is not equalized. Thus, as shown in FIG. 23C, the thickness of the insulating layer 121 at each area after polishing is uneven within the wafer surface, and thereby within the semi-finished semiconductor device. As a result, this method also fails to solve the problem of photolithography. Moreover, in formation of a connection hole such as a via-hole in the insulating layer 121 on the interconnection 114, an opening must be formed in the insulating layer 121 over the interconnection 114 (see FIG. 23D). In this case, if there occurs a variation in the thickness of the insulating layer 121 over each interconnection 114, the etching amount for a thick portion of the insulating layer 121 must be increased, with a result that the etching condition for the insulating layer 121 is complicated. Additionally, in the case of polishing the insulating layer 121 in the condition in which the polishing rate is varied, it is very difficult to control the thickness of the insulating layer 121 after polishing because the polished amount is dependent on the varied amount of the polishing rate.

The related art trench type element isolation region formation process using CMP or mechanical polishing has two disadvantages. One is occurrence of polishing damage to a semiconductor substrate including element isolation regions (see a typical view shown in FIG. 24A), and the other is non-uniformity in polishing within a wafer surface. The occurrence of damage in an element isolation region lowers the withstand voltage of the element isolation region. On the other hand, the occurrence of damage to the semiconductor substrate increases a leak current of a semiconducting element formed in the region of the semiconductor substrate. In FIGS. 24A to 24C, reference numeral 110 indicates a semiconductor substrate; 130 is a bottom portion (recessed portion) of a step portion formed in the semiconductor substrate; 141 is an insulating film made of $SiO_2$; and 131 is an element isolation region.

The occurrence of damage to a semiconductor substrate can be somewhat improved at the sacrifice of the polishing rate and flatness of the insulating film 141. For example, by CMP using abrasives composed of colloidal silica having a small secondary particle size (about 10 nm or less) and a polishing cloth having a relatively low hardness (Asker-C hardness: about 70 to 80), it is possible to reduce the occurrence of damage to a semiconductor substrate. In this case, however, the polishing rate is low (about 10 nm/min or less) and also the ratio of the removed amount of projections to the polished amount is small. Accordingly, it takes two hours or more to polish one wafer, to significantly make poor the throughput. In particular, it is difficult to simultaneously polish a plurality of large sized wafers because of non-uniformity in polishing within a wafer surface. Such a process, therefore, is inconvenient to solve the occurrence of damage to a semiconductor substrate.

In selective removal of an insulating film by CMP, the insulating film is removed by the combination of chemical reaction between a polishing solution and the insulating film, and mechanical polishing for the insulating film using abrasives. In this regard, to solve occurrence of damage to a semiconductor substrate, it may be considered to enhance chemical-polishing characteristic in CMP by depositing as an insulating film made of silicon oxide, polycrystalline silicon, or silicon nitride, which contains impurities, and then planarizing the insulating film by CMP.

For example, when a silicon oxide film is polished, the polishing rate for a silicon oxide film is changed by the addition of an impurity thereto. In general, fumed silica or colloidal silica used as abrasives for polishing a silicon oxide film or silicon nitride film is obtained by dissolution of fine particles of silicon oxide in an alkali solvent. The polishing for a silicon oxide film is performed by two actions: a mechanical polishing action by abrasives composed of silicon oxide and a chemical reaction by an alkali solution. The mechanical action of abrasives is determined by a mechanical force given from a polishing cloth of a polishing apparatus to the abrasives, so that a mechanical polishing force is determined by the amount of vertical pressure applied to the polishing cloth and the rotational speed of the polishing cloth. On the other hand, when the mechanical polishing force is made constant, the polishing rate in mechanical polishing is dependent on bonding forces between atoms and molecules of an object to be polished. Moreover, the chemical reaction of an alkali solution is dependent on a chemical composition of an object to be polished.

In general, as a vertical pressure applied to a polishing cloth and a rotational speed of the polishing cloth are increased, the polishing rate within a wafer becomes uneven. A low mechanical polishing force must therefore be used. As a result, to further increase the polishing rate, chemical reactivity must be increased. The polishing rate can be improved by increasing an alkali concentration in the polishing solution; however, in this case, the stability of the polishing solution is lowered and thereby the concentration of the polishing solution cannot be increased very much.

When the chemical reactivity between the polish and the film is excessively increased, the polishing for an insulating film progresses isotopically, with a result that a reduction in thickness (called "dishing") is generated at a wide width bottom portion (recessed portion) of a step portion. Such a phenomenon is typically shown in FIGS. 24B, 24C. In FIG. 24B, the position of the surface of the insulating film 141 polished by isotropic polishing is indicated by a dashed line.

Accordingly, when the selection of a mechanical polishing condition and abrasives is optimized, it is required to change mechanical and chemical properties of an insulating film to be polished for further increasing the polishing rate thereof. To increase the polishing rate by changing the mechanical property of an insulating film, bonding forces of atoms and molecules must be weakened; however, the change in the mechanical property of an insulating film is not practical because it lowers the strength of the insulating film and increases a variation in stress of the insulating film.

On the other hand, the non-uniformity in polishing within a wafer surface is dependent on two factors: one is a distribution (variation) in thickness of an insulating film within the wafer surface, and the other is a distribution (variation) in polishing rate within the wafer surface. The existing insulating film deposition apparatus (for example, CVD system) for processing an 8 inch wafer causes a distribution (variation) in thickness of an insulating film within a wafer surface at least in a range of from ±3 to 5%. On the other hand, the existing chemical-mechanical polishing apparatus for processing an 8 inch wafer causes a variation in polishing rate within the wafer surface at least in a range of from ±3 to 5%.

The non-uniformity in polishing within a wafer surface thus varies at least in a range of from ±5 to 10% (deposition variation+polishing variation). In the related art trench type element isolation region formation process, only one kind of insulating film is used, so that the polished amount of the insulating film in a wide bottom portion (recessed portion) of a step portion formed on a semiconductor substrate is increased. Consequently, to positively leave the insulating film in a wide bottom portion and to planarize the insulating film as much as possible, the thickness of the insulating film to be deposited must be about twice that of the step portion. For example, when the height of a step portion is 0.5 $\mu$m, the required thickness of the insulating film becomes about 1 $\mu$m. In this case, the non-uniformity in polishing within a wafer surface varies at least in a range of from ±50 to 100 nm.

Japanese Patent Laid-open No. Sho 59-136943 discloses a method for forming element isolation region in which depositing an insulating film having a thickness at least larger than the depth of each trench is deposited over the surface of a semiconductor substrate and removed that insulating film by CMP. In this method, however, only one kind of insulating film is used or an insulating film having two layers similar in polishing rate to each other is used, and thereby it is difficult to solve the dishing phenomenon. Another disadvantage of this method is that since the insulating film having a thickness at least larger than the depth of the trench is deposited over the surface, the non-uniformity in polishing within a wafer surface is degraded.

SUMMARY OF THE INVENTION

An object of the present invention is to provide a method of planarizing a film in a semiconductor device, which is capable of uniformly planarizing films with well controlled polishing while keeping the uniformity in polishing within a wafer surface.

Another object of the present invention is to provide a method of planarizing films in a semiconductor device, which is excellent in prevention of polishing damages on a semiconductor substrate and of unevenness in polishing within a wafer surface which are the disadvantages of a process of forming a trench type element isolation region by chemical-mechanical polishing or mechanical polishing.

To achieve the above objects, according to a first aspect of the present invention, there is provided a method of planarizing films in a semiconductor device, including the steps of:

(a) forming a first film on at least the top of a step portion provided on a base body;

(b) covering the step portion with a second film containing phosphorus in an amount of from 6 to 9 wt % and being higher in polishing rate than the first film; and (c) removing, by polish the second film to expose the first film formed on the top of the step portion.

The step portion may be composed of an interconnection, an element isolation region or the like, and the base body may be composed of a semiconductor substrate, an interlayer insulating layer formed over a semiconductor substrate, or the like. The term, "higher (or lower) polishing rate" means that when first and second films are respectively polished in the same polishing condition using the same polishing apparatus, one film is polished at a higher (or lower) polishing rate $P_{R1}$ than another polishing rate $P_{R2}$. In one embodiment, the polishing rate $P_{R2}$ of the second film is at least twice the polishing rate $PR_{R1}$ of the first film. On a broader scale it is defined that the polishing rate for the second film is higher than that of the first film. When the first film is exposed, it may be polished or not polished. The same is true for the following description.

In the above-described method, the step (b) may be followed by the step (c) without heat treatment on the second film for increasing the polishing rate of the second film. The first film may be either a silicon oxide film or a silicon nitride film, or a stacked film having a silicon oxide layer and a silicon nitride layer; and the second film may be a silicon oxide film containing phosphorus in an amount of from 6 to 9 wt %. Specifically the second film may be a borophosphosilicate glass film or a phosphosilicate glass film. A sufficient polishing rate ratio can be obtained between the first and second films made of the above materials. In addition, examples of silicon oxide may include $SiO_2$ and SiON. The same is true for the following description.

In t his case, preferably, a thickness $T_2$ from the bottom surface of the step portion to the surface of the second film is larger or approximately equal to a value $(H+T_1)$ where H is a height of the step portion and $T_1$ is a thickness of the first film at the top of the step portion. The fact that the thickness $T_2$ is approximately equal to the value $(H+T_1)$ means that the values $T_2$, H, and $T_1$, which are dependent on a polishing apparatus used and a polishing condition, satisfy a relationship of $|T_2-(H+T_1)|\leq 0.1$ $\mu$m. If the value $T_2$ is much smaller than the value $(H+T_1)$, it is likely that part of the second film over the bottom of a step portion will not be polished in the step (c). This results in poor the smoothness of the films.

A step of removing the first film on the top of the step portion can be inserted after the step (c). With this configuration, for example, a semiconducting element can be formed on the top of the step portion from which the first film is removed. On the other hand, the bottom of the step portion buried with the second film constitutes, for example, a trench type element isolation region.

To achieve the above objects, according to a second aspect of the present invention, there is provided a method of planarizing films in a semiconductor device, including the steps of:

(a) forming a first film on at least the top of a step portion provided on a base body, the first film having a thickness of $T_1$ at the top of the step portion and the step portion having a thickness of H;

(b) covering the step portion with a second film in such a manner that a thickness $T_2$ from the bottom surface of the step portion to the surface of the second film is smaller or approximately equal to a value $(H+T_1)$, the second film containing phosphorus in an amount of from 6 to 9 wt % and being higher in polishing rate than the first film;

(c) forming a third film being lower in polishing rate than the second film on the second film in such a manner that a height from the bottom surface of the step portion to the surface of the third film is specified at a value $T_3$; and (d) polishing the third film and the second film for exposing the first film formed on the top of the step portion.

In this case, the fact that the thickness $T_2$ is approximately equal to the value $(H+T_1)$" means that the values $T_2$, H, and $T_1$, which are dependent on a polishing apparatus used and a polishing condition, satisfy a relationship of $|T_2-(H+T_1)|$ $0.1 \mu m$. If the value $T_2$ is much larger than the value $(H+T_1)$, it is likely that the first film on the top of the step portion will not function as a polishing stopper and the first film formed on the top of the step portion will not be exposed in the step (d). This results in poor the smoothness of the films.

In the above-described method, the step (b) may be followed by the step (c) without heat treatment for the second film. The first film may be either a silicon oxide film or a silicon nitride film, or a stacked film having a silicon oxide layer and a silicon nitride layer; the second film may be a silicon oxide containing phosphorus in an amount of from 6 to 9 wt %. Specifically, the second film may be a borophosphosilicate glass film or a phosphosilicate glass film; and the third film may be either a silicon oxide film or a silicon nitride film, or a stacked film having a silicon oxide layer and a silicon nitride layer. A sufficient polishing rate ratio can be obtained between the first, second and third films made of the above materials.

In this case, preferably, the values $T_3$, H and $T_1$, which are dependent on a polishing apparatus and a polishing condition, satisfy a relationship of $|T_3-(H+T_1)| \leq 0.1 \mu m$ for more positively exposing the first film formed on the top of the step portion and more uniformly planarizing the films. In addition, if $|(T_2+T_3)-(H+T_1)|>0.1 \mu m$, a gentle step is generated on the surface of the first, second and third films; however, in some cases, such an adverse effect does not result. In addition, preferably, the values $T_2$, H, and $T_1$, which are dependent on a polishing apparatus and a polishing condition, satisfy a relationship of $T_2-(H+T_1) \leq 0.1 \mu m$ for more positively exposing the first film formed on the top of the step portion and more uniformly planarizing the films.

In the case where the step portion is composed of a trench type element isolation region, the values H, and $T_2$ may satisfy a relationship of $H \leq T_2$. In the case of $T_2<H+T_1$, preferably, $H+T_1<T_3$ or $H<T_3<H+T_1$. If $T_3<H$, it is likely that an electric field will be concentrated at a corner portion of the step portion.

A step of removing the first film on the top of the step portion can be performed after the step (d). With this configuration, for example, a semiconducting element can be formed on the top of the step portion from which the first film is removed, and the bottom portion of the step portion buried with the second and third films constitutes a trench type element isolation region.

In a first mode of the method of planarizing films in a semiconductor device according the second aspect of the present invention, the step (a) can include a step of forming a step portion composed of a recessed portion in the base body and then forming the first film over the entire surface of the base body including the bottom portion of the recessed portion as the step portion. In a second mode of the method of planarizing films in a semiconductor device according to the second aspect of the present invention, the step (a) can include a step of forming the first film on the base body and then forming a step portion composed of a recessed portion in the base body.

In a third mode of the method of planarizing films in a semiconductor device according to the second aspect of the present invention, the step (a) can include a step of forming an oxide film and an upper layer film on the base body, forming a step portion composed of a recessed portion in the base body, and forming an oxide film on the sidewalls and the bottom surface of the recessed portion as the step portion; and the first film on the top of the step portion can be composed of the oxide film and the upper layer film, and the first film on the bottom portion of the step portion can be composed of the oxide film. In this case, the upper layer film constituting the first film may be a silicon nitride film and the oxide film constituting the first film may be a silicon oxide film; the second film may be a silicon oxide film containing phosphorus in an amount of from 6 to 9 wt %, particluarly, a borophosphosilicate glass film or a phosphosilicate glass film; and the third film may be either a silicon oxide film or a silicon nitride film, or a stacked film having a silicon oxide layer and a silicon nitride layer.

To achieve the above objects, according a third aspect of the present invention, there is provided a method of planarizing films in a semiconductor device, including the steps of:

(a) covering n-layer steps ($n \geq 2$) formed on a base body with a first film;

(b) repeating (k−1) times a process of forming a 2m-th film (m=1, 2, . . . , k, and $2 \leq k$) containing phosphorus in an amount of 6 to 9 wt % and being higher in polishing rate than a (2m−1)-th film on the (2m−1)-th film, and forming a (2m+1)-th film being lower in polishing rate than the 2m-th film on the 2m-th film;

(c) forming a 2k-th film containing phosphorus in an amount of 6 to 9 wt % and being higher in polishing rate than a (2k−1)-th film on the (2k−1)-th film; and (d) polishing films from the 2k-th film to the second film to expose the first film formed on the uppermost top of the n-layer steps.

In the above-described method, preferably, the (2m+1)-th film is formed after formation of the 2m-th film without heat treatment for the 2m-th film in the step (b); and the step (c) is followed by the step (d) without heat treatment for the 2k-th film. The 2m-th film (m=1, 2, . . . , k, and $2 \leq k$) may be a silicon oxide film containing phosphorus in an amount of from 6 to 9 wt %, more particluarly, a borophosphosilicate glass film or a phosphosilicate glass film; and the (2m−1)-th film may be either a silicon oxide film or a silicon nitride film, or a stacked film having a silicon oxide layer and a silicon nitride layer. A sufficient polishing rate ratio can be obtained between these films made of the above materials.

In this case, preferably, a thickness $T_{2k}$ from the lowermost bottom surface of the n-layer steps to the surface of the 2k-th film ($2 \leq k$) is larger than or approximately equal to a value $(H+T_1)$ wherein H is a height from the lowermost bottom surface of the n-layer steps to the uppermost top of the n-layer steps and $T_1$ is a thickness of the first film at the uppermost top of the n-layer steps. The fact that the thickness $T_{2k}$ is approximately equal to the value $(H+T_1)$ means that the values $T_{2k}$, H, and $T_1$, which are dependent on a polishing apparatus used and a polishing condition, satisfy a relationship of $|T_2\_k \ (H+T_1)| \leq 0.1 \mu m$. If the value $T_{2k}$ is much smaller than the value $(H+T_1)$, there is a fear that part of the 2k-th film positioned as the uppermost layer over the bottom of the step portion is not polished in the step of exposing the first film formed on the top of the step portion by polishing the 2k-th film. This makes poor the smoothness of the films. Moreover, preferably, k=n (the multi-layer films is composed of 2n-layers), and a thickness $T_{2j+1}$ from the lowermost bottom surface of the n-layer steps to the surface of a (2j+1)-th film (j=1, 2, . . . , k−1, and $2 \leq k$) is approximately equal to a value given by $$T_1 + \sum_{i=n-j+1}^{n} H_i$$

where $T_1$ is a thickness of the first film at the uppermost top of the n-layer steps and $H_1$ is a height of an i-th step (i=1, 2, ..., n) from the lowermost bottom portion of the n-layer steps. The fact that the (2j+1)-th film is approximately equal to the value given by the above relationship means that the values $T_{2j+1}$, H, and $H_i$, which are dependent on a polishing apparatus and a polishing condition, satisfy the following relationship:

$$\left| T_{2j+1} - \left( T_1 + \sum_{i=n-j+1}^{n} H_i \right) \right| \leq 0.1 \, \mu m$$

In a preferred mode of the method of planarizing films in a semiconductor device according to the third aspect of the present invention, preferably, a step of forming a (2k+1)-th film lower in polishing rate than the 2k-th film on the 2k-th film is inserted between the steps (c) and (d), and films from the (2k+1)-th film to the second film are polished in the step (d). With this configuration, the (2k+1)-th film lower in polishing rate, which is positioned as the uppermost layer over the bottom portion of the step portion, functions as a polishing rate, to thereby more positively planarize the films. In this case, preferably, the (2m+1)-th film is formed after formation of the 2m-th film without heat treatment for the 2m-th film in the step (b), and the (2k+1)-th film is formed on the 2k-th film after the step (b) without heat treatment for the 2k-th film.

In another mode of the method of planarizing films in a semiconductor device according to the third aspect of the present invention, preferably, a thickness $T_{2k+1}$ from the lowermost bottom surface of the n-layer steps to the surface of the (2k+1)-th film satisfies a relationship of $|T_{2k+1}-(H+T_1)| \leq 0.1 \, \mu m$ where H is a height from the lowermost bottom surface of the n-layer steps to the uppermost top of the n-layer steps and $T_1$ is a thickness of the first film at the uppermost top of the n-layer steps. In the case, the value $T_{2k+1}$ is out of the above range, a gentle step is generated on the surface of the films; however, in some cases, it does not give adverse effect so much. In addition, preferably, the values $T_{2k}$, H, and $T_1$, which are dependent on a polishing apparatus and a polishing condition, satisfy a relationship of $T_{2k}-(H+T_1) \leq 0.1 \, \mu m$ for more positively exposing the first film formed on the top of the step portion and more uniformly planarizing the films.

In the third aspect of the present invention, preferably, k=n, and a thickness $T_{2j+1}$ from the lowermost bottom surface of the n-layer steps to the surface of a (2j+1)-th film (j=1, 2, ..., k-1, and 2≦k) is approximately equal to a value given by $$T_1 + \sum_{i=n-j+1}^{n} H_i$$

where $T_1$ is a thickness of the first film at the uppermost top of the n-layer steps and $H_1$ is a height of an i-th step (i=1, 2, ..., n) from the lowermost bottom portion of the n-layer steps. In this case, the fact that the (2j+1)-th film is approximately equal to the value given by the above relationship means that the values $T_{2j+1}$, H, and $H_i$, which are dependent on a polishing apparatus and a polishing condition, satisfy the following relationship:

$$\left| T_{2j+1} - \left( T_1 + \sum_{i=n-j+1}^{n} H_i \right) \right| \leq 0.1 \, \mu m$$

In a preferable mode of the method of planarizing films in a semiconductor device according to the third aspect of the present invention, a (2m'-1)-th film (m'=1, 2, ..., k+1, and 2≦k) may be either a silicon oxide film or a silicon nitride film, or a stacked film having a silicon oxide layer and a silicon nitride layer; and the 2m-th film (m=1, 2, ..., k, and 2≦k) may be a silicon oxide film containing phosphorus in an amount of from 6 to 9 wt %, more concretely, a borophosphosilicate glass film or a phosphosilicate glass film. A sufficient polishing rate ratio can be obtained between these films made of the above materials.

BRIEF DESCRIPTION OF THE DRAWINGS

FIG. 10 is a graph showing a relationship between a surface height and a polishing rate for each film formed in the fifth example;

FIGS. 14A, 14B and 14C are typical views, partly in section, of step portions and films formed on a base body, showing a process sequence in a method of planarizing films in a semiconductor device according to a seventh example;

FIGS. 22A, and 22B are typical views, partly in section, of step portions and films formed on a base body, showing a problem in which the thickness of a second film is not suitable in the fifth example;

DETAILED DESCRIPTION OF THE PREFERRED EMBODIMENTS

In this specification, a thickness of each film, a surface height of each film or the height of a step portion is given by an arithmetic average of values measured at a suitable number of points.

The polishing of each film can be performed by a mechanical polishing process or a chemical-mechanical polishing process (CMP process).

Figure 1:
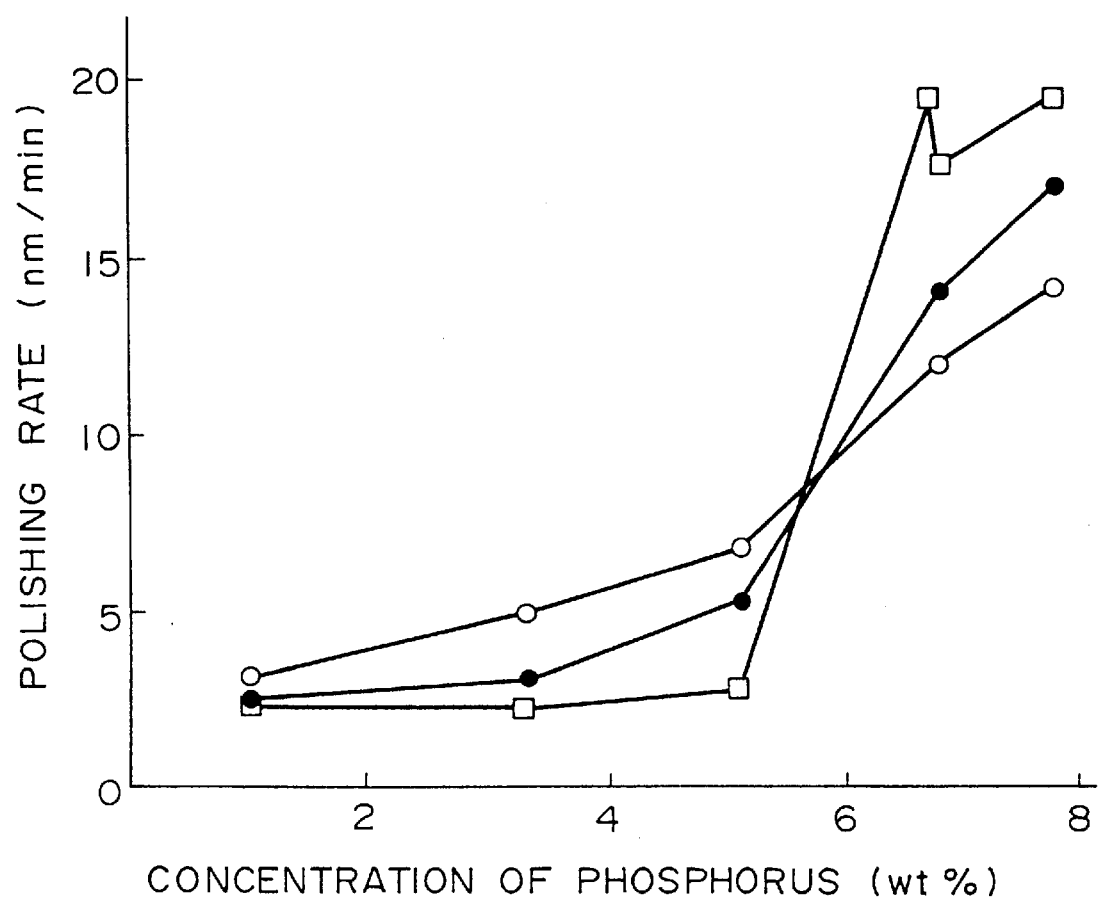
FIG. 1 is a graph showing polishing rates of BPSG films heat-treated at different temperatures with respect to concentrations of phosphorus contained therein.

FIG. 1 is a graph showing polishing rates of borophosphosilicate glass (BPSG) films heat-treated at different temperatures with respect to concentrations of phosphorus contained therein. Here, the BPSG film is deposited at 420° C, by the related art $O_3$-TEOS (tetraethoxysilane) CVD process. The BPSG film is then polished by the CMP process in the following polishing condition:

polishing cloth: nonwoven fabric type
abrasive material: fumed silica
pressure: 500 gf/cm$^2$
rotational speed: 60 rpm The results are shown in FIG. 1, in which a polishing rate shown by a white square indicates the case where the BPSG is not heat-treated after being deposited; a polishing rate shown by a black circle indicates the case where the BPSG is heat-treated in the condition of 490 C.×10 min after being deposited; and a polishing rate shown by a white circle indicates the case where the BPSG is heat-treated in the condition of 950° C.×10 min after being deposited. As is seen from FIG. 1, the polishing rate increases as the concentration of phosphorus in the BPSG increases and it increases as the heat treatment temperature after deposition of the BPSG decreases. Also, the polishing rate rapidly increases and becomes stable as the heat treatment temperature is lowered in a range of the concentration of phosphorus being more than 6 wt %. When the concentration of phosphorus is more than 9 wt %, the polishing rate does not increase so much. In the case of no heat treatment, the polishing rate is nearly saturated when the concentration of phosphorus reaches 9 wt %. In addition, it is desirable to reduce the concentration of phosphorus in the BPSG as much as possible for suppressing the diffusion of impurities from the BPSG. Accordingly, in order to obtain a high polishing rate at a small amount of phosphorus, a film containing phosphorus in an amount of from 6 to 9 wt % is required to be used as a second film or a 2m-th film. Moreover, it is desirable to polish the second film or 2m-th film without heat treatment. The film containing phosphorus in an amount of from 6 to 9 wt % may be composed of a borophosphosilicate glass (BPSG) film or a phosphosilicate glass (SPG) film.

In the method of planarizing films in a semiconductor device according to the present invention (hereinafter, referred to simply as "film planarization method"), a first film, a third film, a (2m−1)-th film or a (2k+1)-th film, which is lower in polishing rate, is formed. Such a film functions as a polishing stopper, which can prevent the occurrence of dishing of a step portion, in particular, dishing of a wide bottom portion (recessed portion) of a step portion. This is effective to prevent lowering of the smoothness of a second film, a 2m-th film, or 2k-th film, and to keep the thickness of the entire film at the bottom portion of a step portion not to be less than a specified value.

In the film planarization method according to the first invention, two films different in polishing rate from each other are stacked on the top of a step portion. With this configuration, the first film formed on the top of the step portion functions as a polishing stopper upon polishing the second film. As a result, it is possible to prevent the dishing of the second film over the bottom of the step portion formed on a base body, and hence to improve the uniformity in polishing within a wafer surface and effectively suppress the occurrence of damages to the base body.

In the film planarization method according to the second invention, three films different in polishing rate from each other are stacked on the top of a step portion. Also, at least two films different in polishing rate from each other are stacked on the bottom of a step portion formed on the base body. With this configuration, the first film formed on the top of the step portion and the third film formed over the bottom of the step portion function as polishing stoppers when the third film and the second film are polished. As a result, it is possible to certainly prevent the dishing of the second film over the bottom of the step portion formed on the base body, and hence to further improve the uniformity in polishing within a wafer surface and more effectively suppress the occurrence of damages to the base body.

In the film planarization method according to the third embodiment of the present invention, 2k-layers of films different in polishing rate from each other are stacked on the uppermost top of steps. With this configuration, the first film formed on the uppermost top of the steps and a (2m−1)-th film formed over each step or the bottom of the steps function as polishing stoppers when films from the 2k-th film to the second film are polished. As a result, it is possible to prevent the occurrence of the dishing of the 2m-th film and the 2k-th film over the bottom of the steps formed on the base body, and hence to improve the uniformity in polishing within a wafer surface and effectively suppress the occurrence of damages to the base body. Moreover, (2k+1)-layers of films different in polishing rate from each other can be stacked on the uppermost top of the steps. In this case, the first film formed on the uppermost top of the steps, the (2m−1)-th film formed over each step or the bottom surface of the steps, and a (2K+1)-th film formed over the bottom surface of the steps function as polishing stoppers when films from the (2k+1)-th film to the second film are polished. As a result, it is possible to more effectively prevent the dishing of the 2m-th film and the 2k-th film over the bottom of the steps formed on the base body, and hence to more effectively improve uniformity in polishing within a wafer surface and suppress the occurrence of damages to the base body.

According to the film planarization method of the present invention, since the dishing of the film at the bottom of a step portion formed on a base body and the uniformity in polishing within a wafer surface can be improved, it is possible to solve the problem in exposure focal depth in photolithography and to a problem in etching for an insulating film due to variations in thickness of the insulating film upon formation of a connection hole.

In the film planarization method according to the second or third embodiment of the present invention, the entire thickness of films deposited over the entire surface of a base body is made to be approximately equal to or smaller than the entire height of the step portion after polishing. The method of the second or third embodiment of the present invention, therefore, is quite different from the technique disclosed in Japanese Patent Laid-open No. Sho 59-136943. In the present invention, since two or more layers of films different in polishing rate from each other are stacked, there is a large difference in film property (polishing rate) between the film on the top of the step portion and part (or all) of the film over the bottom of the step portion during polishing. This allows the entire thickness of the films to be approximately equal to or smaller than the height of the step portion by polishing.

The present invention will be more clearly understood by way of example with reference to the drawings. Examples 1 to 4 concern film planarization methods of the first embodiment of the present invention in which two layers different in polishing rate from each other are stacked on the top of a step portion formed on a base body; Examples 5 to 8 concern film planarization methods of the second invention in which three layers different in polishing rate from each other are stacked on the top of a step portion formed on a base body; and Examples 9 to 11 concern film planarization methods of the third embodiment of the present invention in which 2k-layers of films different in polishing rate from each other are stacked on the uppermost top of step portions formed on a base body.

EXAMPLE 1

Example 1 concerns the film planarization method of the first embodiment of the present invention, which is intended to planarize an insulating film between interconnections, that is, an interlayer insulating film. In this example, the base body is composed of a semiconductor substrate, and the step portion is composed of an interconnection formed on the base body. The first film is made of silicon oxide ($SiO_2$) and the second film is made of BPSG (borophosphosilicate glass). The first film is formed not only on the top of the step portion but also on the sidewalls and the bottom surface of the step portion. The second film is mechanically polished. The first film functions as a polishing stopper for improving uniformity in polishing and it also practically functions to prevent diffusion of impurities from the second film made of BPSG to the base body.

Hereinafter, the film planarization method in Example 1 will be described with reference to FIGS. 2A to 2D. FIGS. 2A to 2D are typical views, partly in section, of step portions and films formed on a base body, showing a process sequence in a method of polishing films according to the second example.

[Step-100]

Figure 2A:
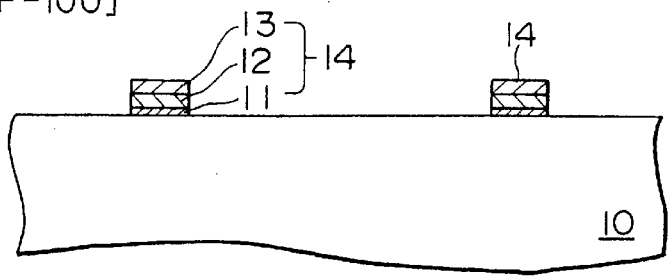
FIGS. 2A, 2B, 2C and 2D are typical views, partly in section, of step portions and films formed on a base body, showing a process sequence in a method of planarizing films in a semiconductor device according to a first example.

Interconnections 14 are first formed on a base body 10 composed of a silicon substrate (see FIG. 2A). More specifically, a silicon oxide film (thickness: 11 nm), a polycrystalline silicon layer 12 doped with phosphorus (P) (thickness: 0.10 $\mu$m), and a tungsten silicide ($WSi_2$) layer 13 (thickness: 0.10 $\mu$m) are formed on the base body 10 by the known film formation process. The tungsten silicide layer 13, the polycrystalline silicon layer 12 and the silicon oxide layer 11 are patterned into a desired shape by photolithography and etching, to form the interconnections 14. In this example, the step portion is equivalent to the interconnection 14. More specifically, the top of the step portion is equivalent to the top of the interconnection 14; the bottom of the step portion is equivalent to the base body 10 exposed between the interconnections 14; and the bottom surface of the step portion is equivalent to the surface of the base body 10 exposed between the interconnections 14. The height H of the step portion is 0.21 $\mu$m.

[Step-110]

Figure 2B:
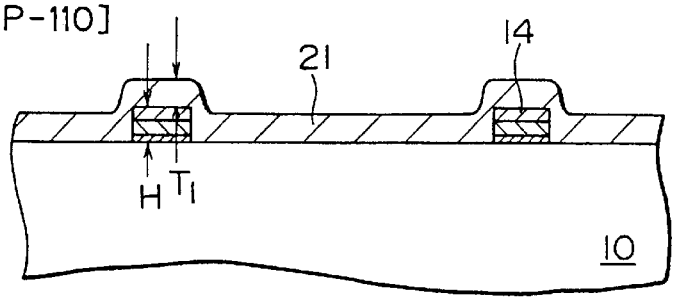

A first film 21 is formed at least on the step portions provided on the base body 10 (see FIG. 2B). The first film 21 is formed not only on the top of each interconnection 14 as the step portion but also on the bottom of the step portion in this example. The first film is made of $SiO_2$, which can be formed by plasma CVD using tetraethoxysilane (TEOS). The thickness $T_1$ of the first film 21 at the top of the step portion is set at 0.60 $\mu$m. The film formation condition for the first film 21 is as follows:

gas used: $O_2/H_2$=6/1.5 sccm
film formation temperature: 850° C.
film formation time: 100 min.
$T_1$: 0.60 $\mu$m

[Step-120]

Figure 2C:
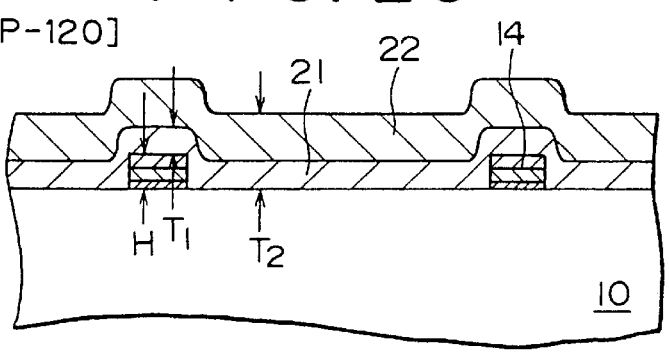

The step portion is then covered with a second film 22 higher in polishing rate than the first film 21 (see FIG. 2C). The second film 22 is made of BPSG in this example, which is formed by low pressure CVD. The BPSG contains boron (B) in an amount of 4 wt % and phosphorus (P) in an amount of 7 wt %. The thickness of the second film 22 at the bottom of the step portion is set at 0.40 $\mu$m. Namely, the thickness $T_2$ from the bottom surface of the step portion to the surface of the second film 22 is 1.0 $\mu$m (=0.60 $\mu$m+0.40 $\mu$m). Accordingly, the thickness $T_2$, H and $T_1$ satisfy the relationship of $T_2$ (=1.0 $\mu$m)>(H+$T_1$) (0.81 $\mu$m=0.21 $\mu$m+0.60 $\mu$m). The film formation for the second film 22 is as follows. In addition, the second film 22 made of BPSG is not heat-treated after being deposited.

gas used: $SiH_4/PH_3/B_2H_6$ film formation temperature: 400° C.

reaction pressure: normal pressure

[Step-130]

Figure 2D:
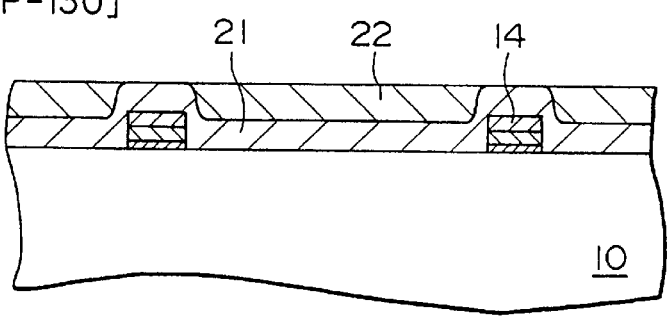

The second film 22 is then mechanically polished, to expose the first film 21 formed on the top of the interconnection 14 as the step portion (see FIG. 2D). The mechanical polishing is performed using a velour type polishing cloth (Asker-C hardness: about 82–85) and a polishing solution containing fumed silica having a suitable composition mixed with pure water at a mixing ratio of 1:2. The supplied amount of the polishing solution is set at 30 $cm^3$/min; the polishing pressure is 130 $g/cm^2$; and the rotating speed of a surface table is 38 rpm.

The first film 21 remains at the top of the interconnection 14 as the step portion, and the first and second films 21, 22 are formed on the base body 10 between the interconnections 14, that is, on the bottom of the step portion. The surface of the first film 21 at the top of the interconnection 14 as the step portion is approximately at the same level (height) as that of the surface of the second film 22 over the bottom of the step portion. The interconnection structure formed in this example thus includes a plurality of the interconnections 14 formed on the base body 10, the first film 21 formed on the top of each interconnection 14, and the first and second films 21, 22 formed on the base body 10 between the interconnections 14, wherein the surface of the first film 21 is approximately at the same level as that of the second film 22.

The polishing rate of the first film 21 made of silicon oxide ($SiO_2$) is 12 nm/min. On the other hand, the polishing rate of the second film 22 made of BPSG is 100 nm/min. The polishing rate of the second film 22 is about eight times of that of the first film 21, that is, a sufficient selective ratio in polishing rate is generated between the first and second films 21, 22. Since the second film 22 is thus polished easier than the first film 21, the polishing for the second film 22 on the interconnection 14 as the step portion proceeds until the first film 21 on the top of the projecting interconnection 14 is exposed, and then the polishing rate for the exposed portion (first film 21) becomes lower. Thus, even if the polishing rates for films are uneven within a polishing surface, the polishing rate for the previously exposed first film 21 is suppressed.

Figure 21A:
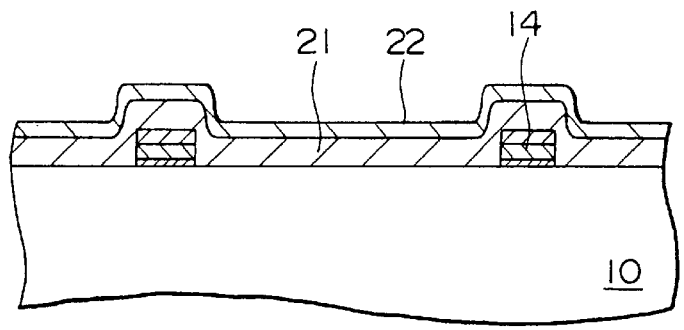
FIGS. 21A, 21B, 21C and 21D are typical views, partly in section, of step portions and films formed on a base body, showing a problem in which the thickness of a second film is not suitable in the first and second examples.
Figure 21B:
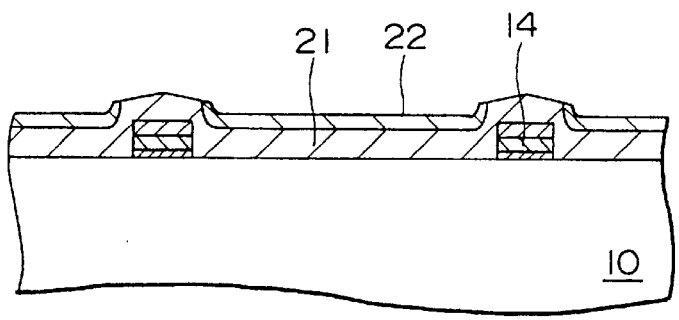

The first film 21 which is lower in polishing rate, acts as a polishing stopper, and the second film 22 is polished until the first film 21 on another interconnection 14 is exposed. When the first film 21 on all or substantially all of the interconnections 14 is thus exposed, the polishing is completed. At this time, the total of the thicknesses of the first and second films 21, 22 at the bottom portion of each step portion is equalized within the wafer surface. As a result, the global planarization for the films within the wafer surface can be realized. In addition, when the value $T_2$ is very smaller than the value $(H+T_1)$ as shown in FIG. 21A, part of the second film 22 over the bottom portion of the step portion is not polished at Step-130 as shown in FIG. 21B.

Modification of Example 1

Figure 3A:
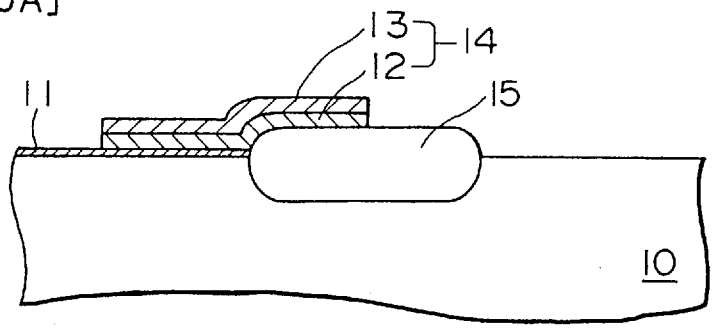
FIGS. 3A, 3B and 3C are typical views, partly in section, of step portions and films formed on a base body, showing a process sequence in a method of planarizing films in a semiconductor device according to a modification of the first example.

In this modification, the base body 10 is composed of a semiconductor body, and the step portion is composed of an interconnection 14 formed on an element isolation region 15 having an LOCOS structure formed on the base body (se FIG. 3A). Namely, the step portion has two-fold steps: the first step composed of the element isolation region 15 having the LCOS structure, and the second step composed of the interconnection 14.

Figure 3B:
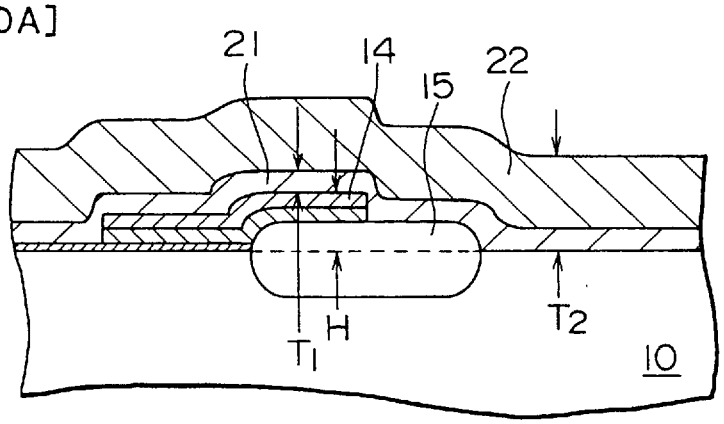
Figure 3C:
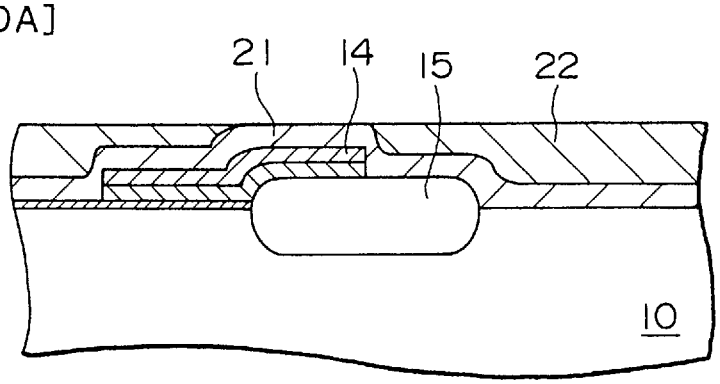

Like Example 1, the first film is made of silicon oxide ($SiO_2$) and the second film is made of BPSG. The second film is mechanically polished. The planarization method in this modification is the same as that in Example 1, except for the configuration of the step portion, and therefore, the detailed explanation thereof is omitted. In addition, the height H of the step portion is set at 0.35 μm. More specifically, the height of the first step composed of the element isolation region 15 (from the base body 10 to the top of the element isolation region 15) is 0.15 μm, and the height of the second step composed of the interconnection 14 (thickness of the interconnection 14) is 0.20 μm. FIGS. 3A to 3C are typical views, partly in section, of step portions and films formed on a base body, showing Step-100A (equivalent to Step 100 in Example 1), Step 120A (equivalent to Step 120 in Example 1), and Step 130A (equivalent to Step 130 in Example 1), respectively.

EXAMPLE 2

This example also concerns the method of planarizing films in a semiconductor devices according to the first embodiment of the present invention, in which trench type element isolation regions are formed. In this example, a base body is composed of a semiconductor substrate, and a step portion is composed of a recessed portion formed in the base body. A first film is made of silicon oxide ($SiO_2$), and a second film is made of BPSG. The first film is formed not only on the top of each step portion (surface of the base body) but also on the side walls and the bottom surface of the step portion (recessed portion formed in the base body). The second film is mechanically polished. The first film functions as a polishing stopper for improving the uniformity in polishing and also practically functions to prevent the diffusion of impurities from the second film made of BPSG to the base body.

Hereinafter, the method of planarizing films in Example 2 will be described with reference to FIGS. 4A to 4D. FIGS. 4A to 4D are typical views, partly in section, of step portions and films formed on a base body, showing a process sequence in a method of planarizing films according to the second example.

[Step-200]

Recessed portions 30 are formed in a base body 10 composed of a silicon substrate by photolithography and etching. The recessed portion 30 constitutes a step portion. More specifically, the top of the step portion is equivalent to the surface of the base body 10; the bottom of the step portion is equivalent to the bottom of the recessed portion 30; and the bottom surface of the step portion is equivalent to the bottom surface of the recessed portion 30. The depth of the recessed portion 30 (height H of the step portion) is set at 0.30 μm. Then, the whole of the base body 10 including the interior of the recessed portions 30 is oxidized, to form a first film 21 made of $SiO_2$ (see FIG. 4A). The thickness $T_1$ of the first film 21 on the top of the step portion is set as 20 nm. The oxidation condition, for example, by a dry thermal oxidation process is as follows:

oxidation atmosphere: dry oxygen oxidation temperature: 1000° C.

$T_1$: 20 nm

[Step-210]

A channel stop region (not shown) is formed on the bottom of the recessed portion 30 by ion implantation for the recessed portion 30 as needed. After that, the step portion is covered with a second film 22 higher in polishing rate than the first film 21 (see FIG. 2B). The second film 22 is made of BPSG, which is basically formed in the same manner as that described in Step-120 of Example 1. The thickness of the second film 22 at the bottom surface of the step portion (recessed portion 30) is set at 0.60 $\mu$m. Namely, the thickness $T_2$ from the bottom surface of the step portion to the surface of the second film 22 becomes 0.62 $\mu$m (=0.02 $\mu$m+0.60 $\mu$m). Accordingly, the thickness $T_2$, H and $T_1$ satisfy the relationship of $T_2$ (=0.62 $\mu$m)>(H+$T_1$) (0.32 $\mu$m=0.30 $\mu$m+0.02 $\mu$m).

[Step-220]

Figure 4A:
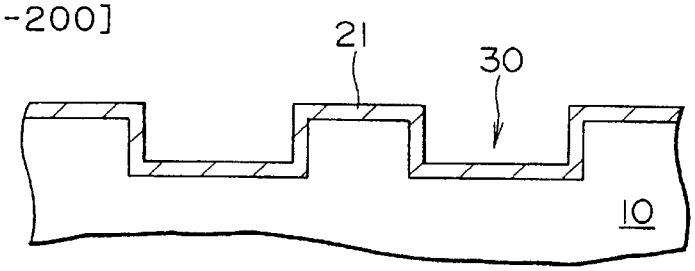
FIGS. 4A, 4B, 4C and 4D are typical views, partly in section, of step portions and films formed on a base body, showing a process sequence in a method of planarizing films in a semiconductor device according to a second example.
Figure 4B:
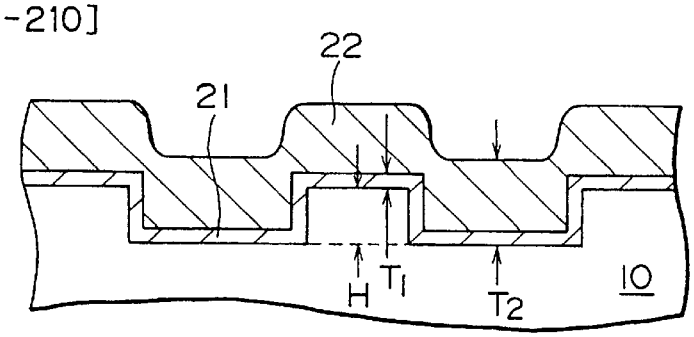
Figure 4C:
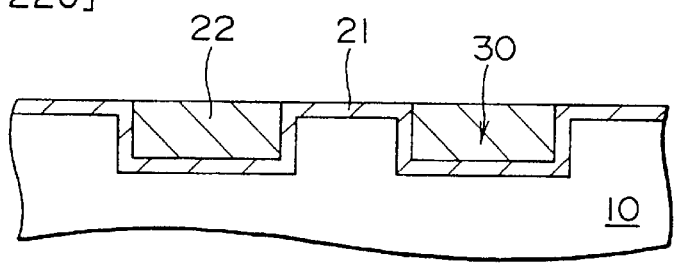
Figure 4D:
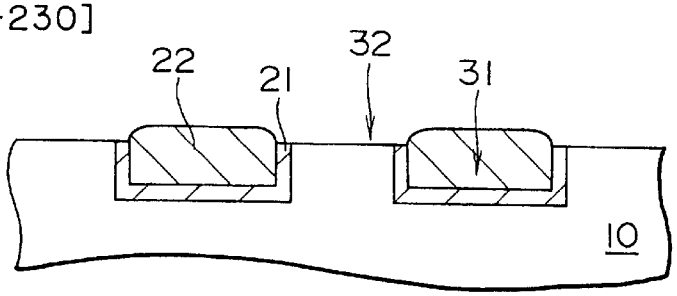

After that, the second film 22 is polished in the same manner as that described in Step-130 of Example 1, to expose the first film 21 formed on the base body 10 equivalent to the top of the step portion (see FIG. 4C).

[Step-230]

The first film 21 remaining on the surface of the base body 10 is then removed using 0.5% diluted hydrofluoric acid. Thus, as typically shown in FIG. 4D, the recessed portions 30 are buried with the second film 22 made of BPSG, so that trench type element isolation regions 31 each having a substantially smooth surface are formed and a semiconducting element forming region 32 is formed between the element isolation regions 31. The first film 21 remaining on the surface of the base body 10 may be removed by polishing.

The element isolation region 31 having the trench structure formed in Example 2 includes the recessed portion 30 formed in the base body 10, the first film 21 formed on the bottom surface and the side walls of the recessed portion 30, and the second film 22 buried in the recessed portion 30.

Figure 21C:
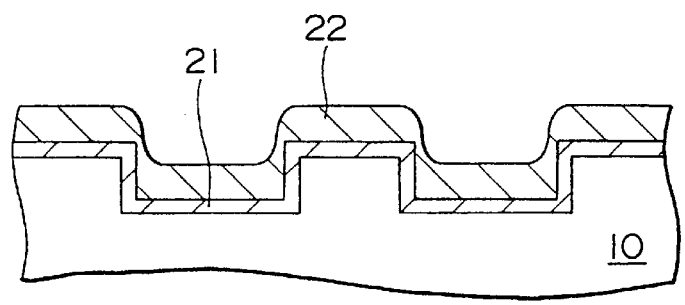
Figure 21D:
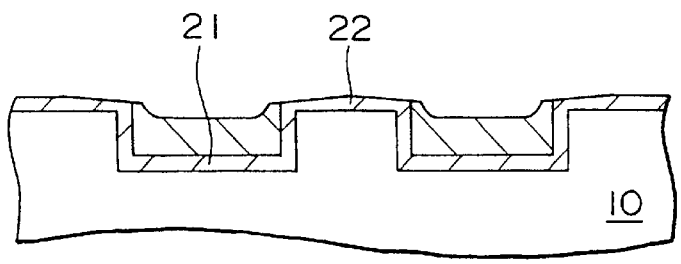
Figure 23A:
FIGS. 23A, 23B, 23C and 23D are typical views, partly in section, of step portions and films formed on a semiconductor substrate, showing a related art method of planarizing films.
Figure 23B:
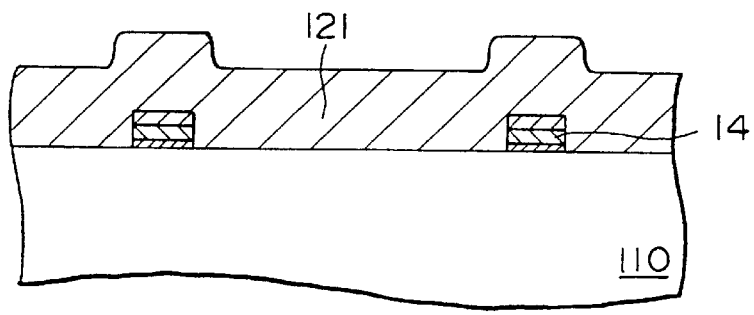
Figure 23C:
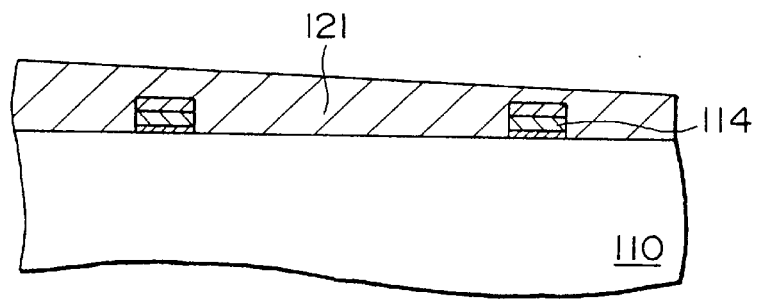
Figure 23D:
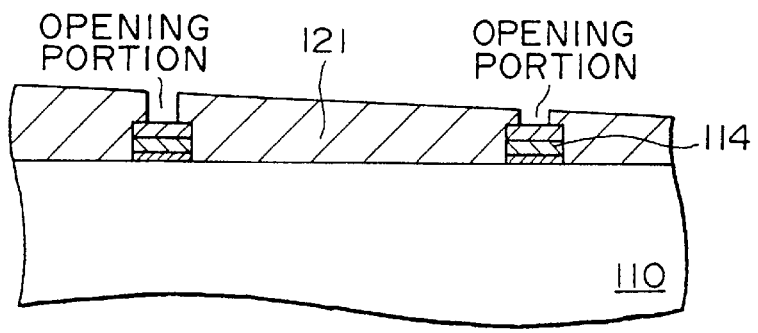
Figure 24A:
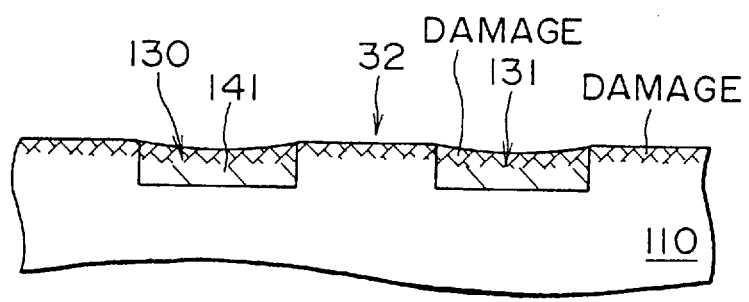
FIGS. 24A, 24B and 24C are typical views, partly in section, of step portions and films formed on a semiconductor substrate, showing a problem in a related art method of forming a trench type element isolation region using a CMP process.
Figure 24B:
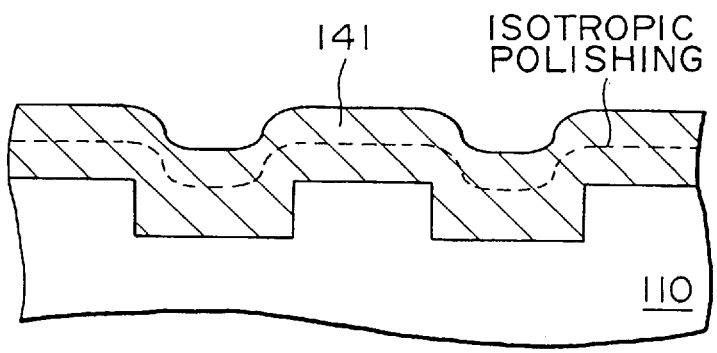
Figure 24C:
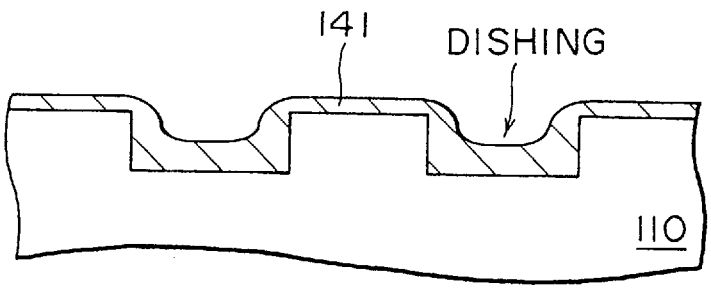

When the value $T_2$ is very smaller than the value (H+$T_1$) as shown in FIG. 21C, part of the second film 22 over the bottom of the step portion is not polished at Step-230 as shown in FIG. 21D.

EXAMPLE 3

Figure 5A:
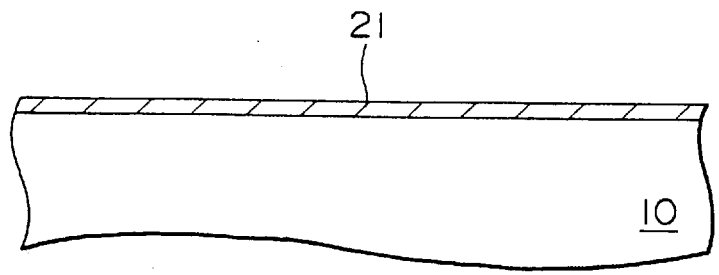
FIGS. 5A, 5B and 5C are typical views, partly in section, of step portions and films formed on a base body, showing a process sequence in a method of planarizing films in a semiconductor device according to a third example.
Figure 5B:
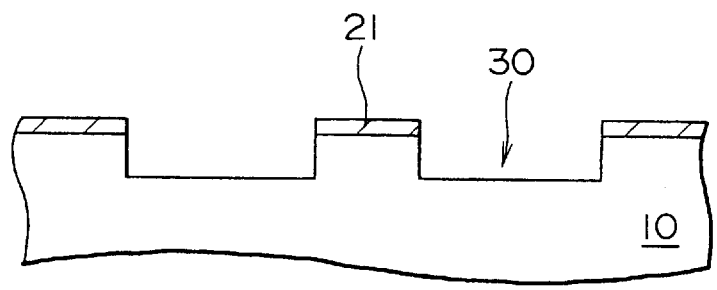

This example is a modification of Example 2, which is different therefrom in formation of a step portion (recessed portion) and a first film. Specifically, as shown in FIG. 5A, a first film 21 is formed only on the surface of a base body 10. The first film 21 is made of silicon oxide ($SiO_2$) or silicon nitride ($Si_3N_4$) by a CVD process. The first film and the base body 10 are selectively etched by photolithography and etching, to form a step portion composed of a recessed portion 30 in the base body 10 (see FIG. 5B). The first film 21 is formed only on the surface of the base body 10, that is, the first film 21 is formed only on the top of the step portion provided on the base body 10.

Figure 5C:
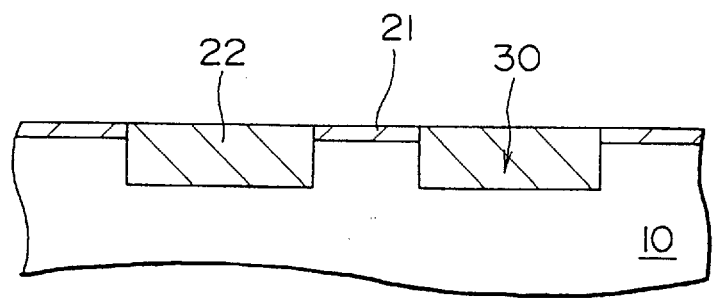

A second film 22 is then formed in the same manner as that described in Step-120 of Example 1 and is polished in the same manner as that described in Step-130 of Example 1, to expose the first film 21 formed on the base body 10 equivalent to the top of the step portion (see FIG. 5C). Next, the first film 21 remaining on the surface of the base body 10 is removed in the same manner as that described in Step-230 of Example 2. In the case where the first film 21 is made of silicon nitride, it may be removed using phosphoric acid kept at 140° C.

EXAMPLE 4

Figure 6A:
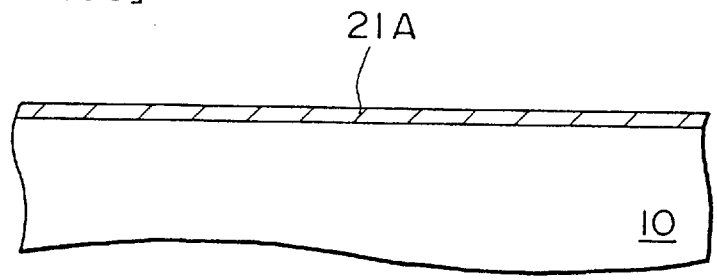
FIGS. 6A, 6B and 6C are typical views, partly in section, of step portions and films formed on a base body, showing a process sequence in a method of planarizing films in a semiconductor device according to a fourth example.
Figure 6B:
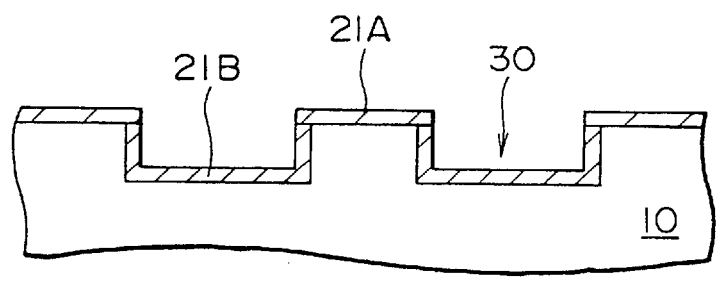
Figure 6C:
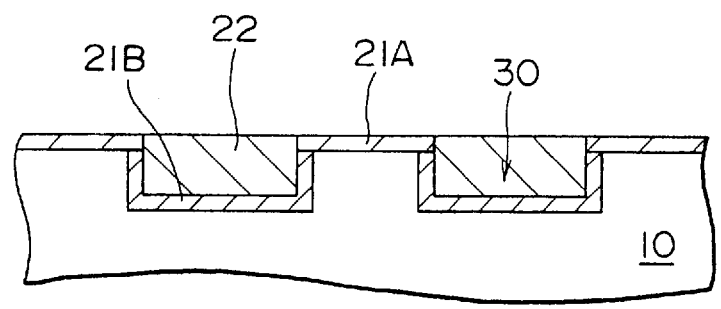

This example is another modification of Example 2, which is different therefrom in formation of a step portion (recessed portion) and first films 21A, 21B. Hereinafter, this example will be described with reference to FIGS. 6A to 6C. FIGS. 6A to 6C are typical views, partly in section, of step portions and films formed on a base body, showing a process sequence in a method of planarizing films according to the fourth example.

[Step-400]

A first film 21A is formed on the surface of a base body 10 as shown in FIG. 6A. Specifically, an oxide film ($SiO_2$) is formed on the base body 10 composed of a silicon substrate in the following condition by a pyrogenic process.

oxidation atmosphere: $O_2/H_2$=4/1
oxidation temperature: 850° C.

Next, an upper layer film made of silicon nitride ($Si_3N_4$) is formed on the oxide film by CVD. The first film 21A is composed of the oxide film ($SiO_2$) and the upper layer film ($Si_3N_4$).

[Step-410]

The upper layer film made of silicon nitride, which constitutes the first film 21A, is selectively removed by photolithography and etching, and the oxide film and the base body 10 are selectively etched using the upper layer film made of silicon nitride as a mask, to form a recessed portion as a step portion in the base body 10. Next, the recessed portion 30 is oxidized by a thermal oxidation process, to form an oxide ($SiO_2$) film 21B on the bottom surface and the sidewalls of the recessed portion 30 (see FIG. 6B). The thermal oxidation is performed in the following condition:

oxidation atmosphere: dry oxygen
oxidation temperature: 1000° C.

The first films 21A, 21B are thus formed. In addition, the first film 21A on the top of the step portion is made of the oxide film and the upper layer film, and the first film 21B on the bottom of the step portion is made of the oxide film. The first film 21A functions as a polishing stopper for improving the uniformity in polishing; and the first film 21B functions to prevent the diffusion of impurities from a second film 22 made of BPSG to the base body 10.

[Step-420]

The second film 22 is formed in the same manner as that described in Step-120 of Example 1, and is polished in the same manner as that described in Step-130 of Example 1, to expose the first film 21A formed on the base body 10 equivalent to the top of the step portion (see FIG. 6c).

[Step-430]

Next, the first film 21A remaining on the surface of the base body 10 is removed in the same manner as that described in Step-230 of Example 2. In addition, silicon nitride ($Si_3N_4$) constituting the first film 21A is removed using phosphoric acid kept at 140° C., and silicon oxide ($SiO_2$) constituting the first film 21A is removed using 0.5% diluted hydrofluoric acid.

EXAMPLE 5

This example concerns a method of planarizing films according to the second embodiment of the present invention, which is intended to planarize an insulating film formed between interconnections like Example 1. In this example, a base body is composed of a semiconductor substrate, and a step portion is composed of an interconnection formed on the base body. Each of first and third films is made of silicon oxide ($SiO_2$), and a second film is made of BPSG. The first film is formed not only on the top of the step portion but also on the sidewalls and the bottom surface of the step portion. The third and second films are polished by the CMP process. In addition, the first film functions as a polishing stopper for improving the uniformity in polishing, and it also practically functions to prevent the diffusion of impurities from the second film made of BPSG to the base body.

The method of planarizing films in this example will be described with reference to FIGS. 7A to 7D. FIGS. 7A to 7D are typical views, partly in section, of step portions and films formed on a base body, showing a process sequence in a method of planarizing films according to the fifth example.

[Step-500]

Figure 7A:
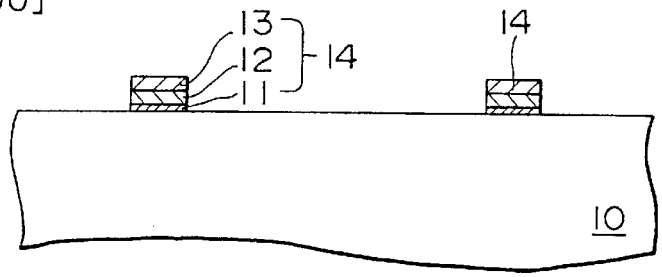
FIGS. 7A, 7B, 7C and 7D are typical views, partly in section, of step portions and films formed on a base body, showing a process sequence in a method of planarizing films in a semiconductor device according to a fifth example.

Interconnections 14 are formed on a base body 10 composed of a semiconductor substrate in the same manner as that described in Step-100 of Example 1 (see FIG. 7A). The interconnection is, for example, a gate electrode of a MOS transistor or the extension of the gate electrode. The height H of the step portion is 0.21 $\mu$m.

[Step-510]

A first film 41 is formed at least on the top of each step portion provided on the base body 10. In this example, the first film 41 is formed not only on the top of each interconnection 14 as the step portion but also on the bottom of the step portion. Namely, the first film 41 is formed over the entire surface of the base body 10 including the interconnections 14. The first film 41 is made of silicon oxide ($SiO_2$), which is formed by plasma CVS using tetraethoxysilane (TEOS). The thickness $T_1$ of the first film 41 at the top of the step portion is set at 0.20 $\mu$m. The formation condition for the first film 41 is basically the same as that described in Step-110 of Example 1.

[Step-520]

Figure 7B:
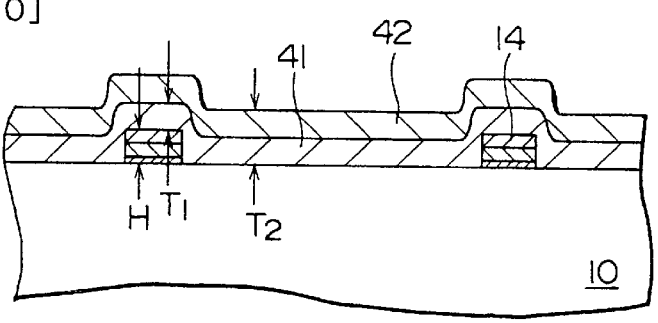

The step portion is then covered with a second film 42 higher in polishing rate than the first film 41 in such a manner that the thickness $T_2$ from the bottom surface of the step portion (the surface of the base body 10) to the surface of the second film 42 is smaller than or approximately equal to the value (H+$T_1$) (see FIG. 7B). The second film 42 is made of BPSG, which is formed by low pressure CVD as in Step-120 of Example 1. The thickness of the second film 42 at the bottom portion of the step portion is set at 0.23 $\mu$m. The thickness $T_2$ from the bottom surface of the step portion to the surface of the second film 42 becomes 0.43 $\mu$m (=0.20 $\mu$m+0.23 $\mu$m). As a result, the value (=0.43 $\mu$m) of $T_2$ is approximately equal to the value (H+$T_1$) (0.41 $\mu$m=0.21 $\mu$m+0.20 $\mu$m), and the values $T_2$, H and $T_1$ satisfy the relationship of $T_2-(H+T_1) \leq 0.1$ $\mu$m. In addition, the second film 42 made of BPSG is not heat-treated after being deposited.

[Step-530]

Figure 7C:
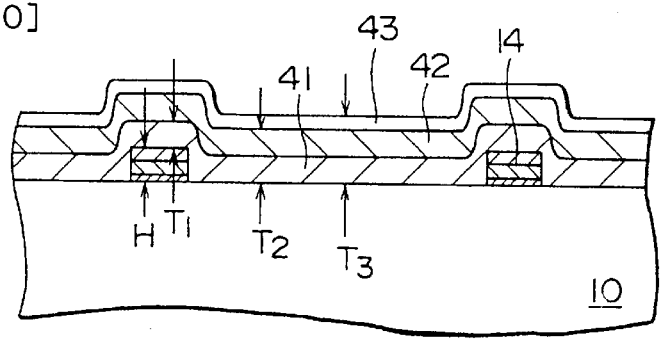

A third film 43 (thickness: 50 nm) lower in polishing rate than the second film 42 is formed on the second film 42 (see FIG. 7C). The thickness $T_3$ from the bottom surface of the step portion (surface of the base body 10) to the surface of the third film 43 becomes 0.48 $\mu$m. The third film 43 is made of non-doped silicate glass (NSG film containing silicon oxide, $SiO_2$), which is formed at a substrate temperature of 410° C. by low pressure CVD using $SiH_4$ gas. Alternatively, the third film 43 may be made of silicon oxide, which is formed by plasma CVD using tetraethoxysilane (TEOS). In addition, the thickness of the third film 43 satisfies the relationship of $|T_3-(H+T_1)| \leq 0.1$ $\mu$m. In addition, the third film 43 may be made of silicon nitride ($Si_3N_4$).

[Step-540]

Figure 7D:
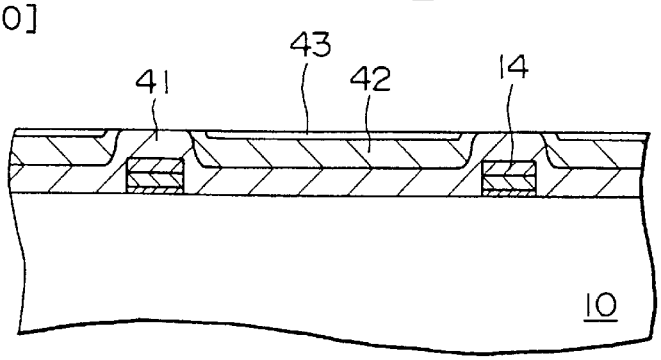

Next, the third film 43 and the second film 42 are polished by the CMP process, to expose the first film 41 formed on the top of the interconnection 14 as the step portion (see FIG. 7D). The polishing is performed using a polishing cloth SUBA800 (Asker-C hardness: about 80–100) and a polishing solution composed of fumed silica having a suitable composition. Moreover, the supplied amount of the polishing solution is set at 4 $cm^3$/min; the polishing pressure is 200 g/$cm^2$; and the rotational speed of a surface table is 40 rpm.

The third film 43 and the second film 42 may be mechanically polished in the same manner as that described in Step-130 of Example 1.

In this way, the first film 41 remains on the top of the interconnection 14 as the step portion, and the stacked layer composed of the first, second and third films 41, 42, 43 are formed on the base body 10 as the bottom portion of the step portion. The surface of the first film 41 on the top of the interconnection 14 as the step portion is substantially at the same level (height) as that of the surfaces of the second film 42 and the third film 43 over the bottom portion of the step portion.

The interconnection structure in this example includes a plurality of the interconnections 14 formed on the base body 10; the first film 41 formed on the tops of these interconnections 14; a stacked layer composed of the second an third films 42, 43 stacked on the base body 10 between the interconnections 14. The surface of the first film 41 is substantially at the same level as that of the surfaces of the second and third films 42, 43, and the second film 42 is exposed between the first and third films 41, 43.

The polishing rate of each of the first film 41 and the third film 43 made of silicon oxide ($SiO_2$) is 12 nm/min. On the other hand, the polishing rate of the second film 42 made of BPSG is 100 nm/min. Accordingly, the polishing rate of the second film 42 is higher about eight times than that of each of the first and third films 41, 43, and thereby a sufficient selection ratio in polishing rate is generated therebetween. In other words, the second film 42 is polished easier than the first and third films 41, 43. Thus, the polishing of the third film 43 and the second film 42 on the top of the interconnection 14 as the step portion proceeds until the first film 41 on the top of the projecting interconnection 14 is exposed (or directly before being exposed), and then the third film 43 over the bottom of the step portion is started to be polished. Accordingly, the first film 41 on the top of the step portion and the third film 43 on the bottom of the step portion function as polishing stoppers. Namely, the portion of the second film 42 surrounded by the first film 41 on the top of the step portion and the third film 43 over the bottom of the step portion is suppressed in polishing rate.

The first film 41 and the third film 43 lower in polishing rate thus act as the polishing stoppers, and the third film 43 and the second film 42 are polished until the first film 41 on another interconnection 14 is exposed. In this way, when the first film 41 on all or substantially all of the interconnections 14 formed on the wafer is exposed, the polishing is completed. Alternatively, when the third film 43 over the bottom of all or substantially all of the step portions formed on the base body 10 becomes the uppermost top, the polishing is completed. The total of the thicknesses of the first, second and third films 41, 42, 43 on the bottom of each step portion is equalized in a wafer surface. Thus, the global planarization of the films on a wafer surface can be realized. In the case where the value $T_2$ is much larger than the value (H+$T_1$) as shown in FIG. 22A, the polishing for each film is insufficient in Step-540 as shown in FIG. 22B, failing to obtain the smoothness of the films.

While each of the first film 41 and the third film 43 is made of silicon oxide and the second film 42 is made of BPSG, each of the first film 41 and the third film 43 may be made of a material lower in polishing rate than the second film 42. For example, each of the first film 41 and the third film 43 may be made of silicon nitride or the combination of silicon oxide and silicon nitride. The second film 42 may be made of PSG or the combination of BPSG (or PSG) and polycrystalline silicon. With this material combination of the films, the second film 42 is sufficiently higher in polishing rate than the first film 41, and the third film 43 is sufficiently higher in polishing rate than the second film 42.

Next, the polishing mechanism in Example 5 will be described with reference to polishing sequences of films shown in FIGS. 8A to 8C, and FIGS. 9A, 9B and a graph shown in FIG. 10 in which the surface height of each film is plotted with respect to the polishing time. In FIG. 10, lines A, B, C and D indicate heights of each film at regions A, B, C and D in FIGS. 8A to 8C, and FIGS. 9A, 9B, respectively. In FIG. 10, the ordinates indicates the surface height based on the surface of the base body 10, and the abscissa indicates the polishing time.

Figure 8A:
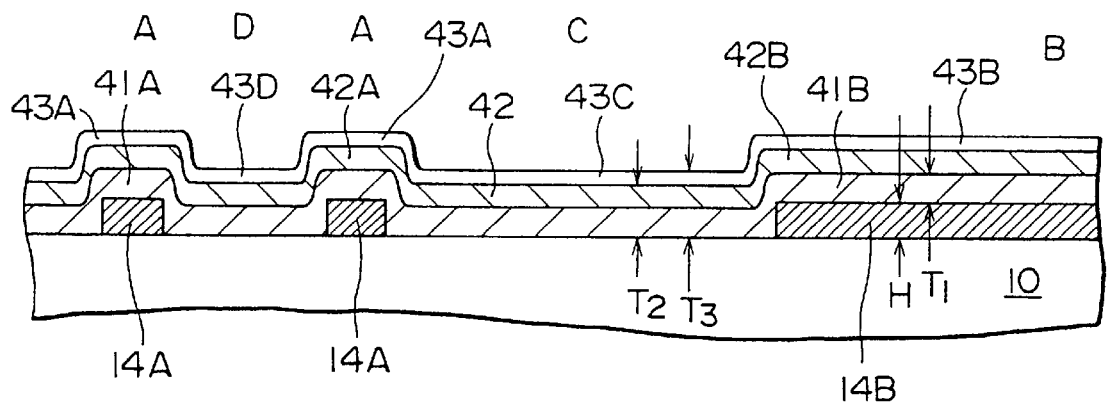
FIGS. 8A, 8B and 8C show a polishing sequence for the films formed in the fifth example.

As shown in FIG. 8A, interconnections 14 (14A, 14B) are formed on a base body 10. A first film 41 is formed on the entire surface of the base body 10 including the interconnections 14. In addition, a portion of the first film 14 on the top of a narrow width interconnection 14A (equivalent to a region A) is indicated by reference numeral 41A; and a portion of the first film 41 on the top of a wide width interconnection 14B (equivalent to a region B) is indicated by reference numeral 41B. A second film 42 higher in polishing rate than the first film 41 is formed on the surface of the first film 41 in such a manner that $T_2$ is smaller than or approximately equal to the value $(H+T_1)$. In addition, a portion of the second film 42 on the top of the narrow width interconnection 14B (equivalent to the region A) is indicated by reference numeral 42A; and a portion of the second film 42 on the top of the wide width interconnection 14B (equivalent to the region B) is indicated by reference numeral 42B. A third film 43 lower in polishing rate than at least the second film 42 is formed on the second film 42. In addition, a portion of the third film 43 over the narrow width interconnection 14A (equivalent to the region A) is indicated by reference numeral 43A; a portion of the third film 43 over the wide width interconnection 14B (equivalent to the region B) is indicated by reference numeral 43B; a portion of the third film 43 over a wide bottom of the step portion (equivalent to a region C) is indicated by reference numeral 43C; and a portion of the third film 43 over a narrow bottom of the step portion (equivalent to a region D) is indicated by reference numeral 43D.

In particular, the third film 43C is formed in such a manner as to be approximately at the same level as that of the surfaces of the first films 41A, 41B formed on the tops of the interconnections 14. As shown in FIG. 10, the surface height of the stacked films in such a state is $h_3$ $(=H+T_3)$ in the regions A, B; and $h_1$ $(=T_3)$ in the regions C, D. In addition, $h_2=H+T_2$.

Figure 8B:
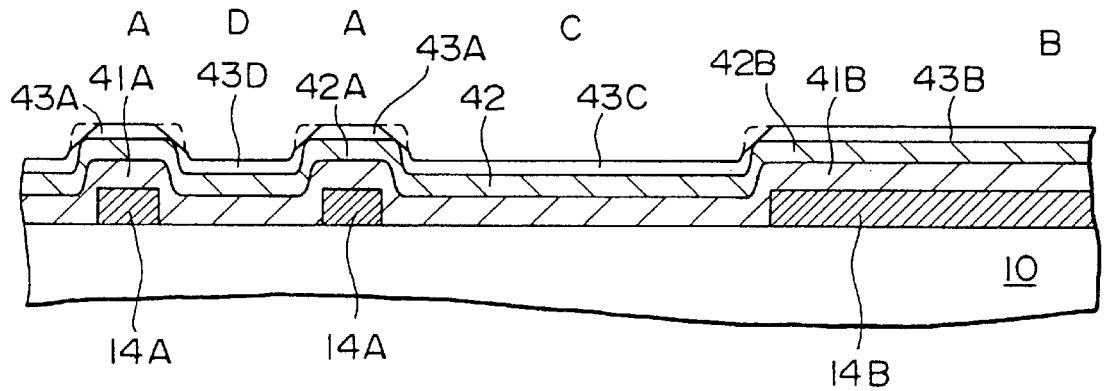

The polishing starts in such a state. As shown in FIG. 8B, in the beginning stage of polishing, the ridgelines of the third films 43A, 43B (shown by the broken line) are mainly polished. In this stage, the third film 43C in the region C and the third film 43D in the region D are little polished. Also, since the third film 43A in the region A receives a polishing pressure component in the direction perpendicular to the surface of the base body 10 more than the third film 43B in the region B, the polishing rate of the third film 43A in the region A is higher than that of the third film 43B in the region B.

Figure 8C:
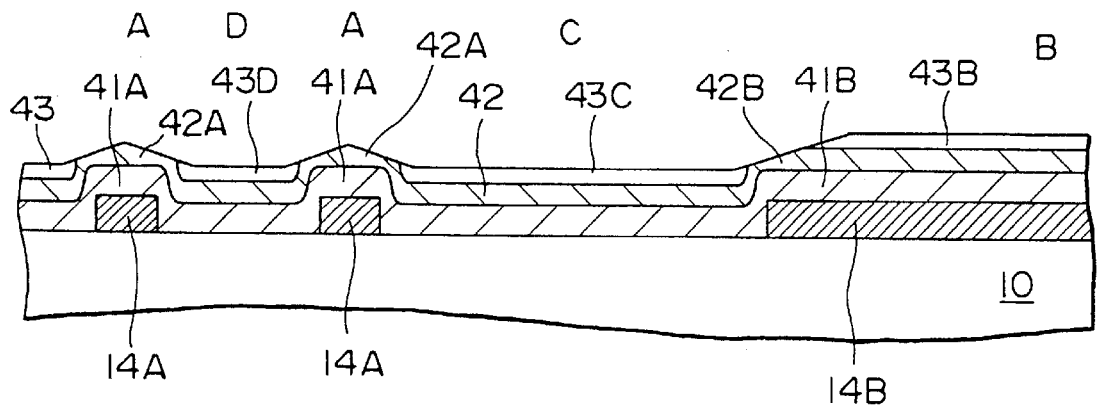

As the polishing proceeds, the third film 43A in the region A is removed and the second film 42A under the third film 43A is started to be polished in a so-called drooped shape, as shown in FIG. 8C. On the other hand, the edge portion of the third film 43B in the region B is polished and the second film 42B in the vicinity of the third film 43 thus polished is obliquely polished. The surface height of each film in such a stage is plotted with respect to a time $t_A$ in FIG. 10.

Figure 9A:
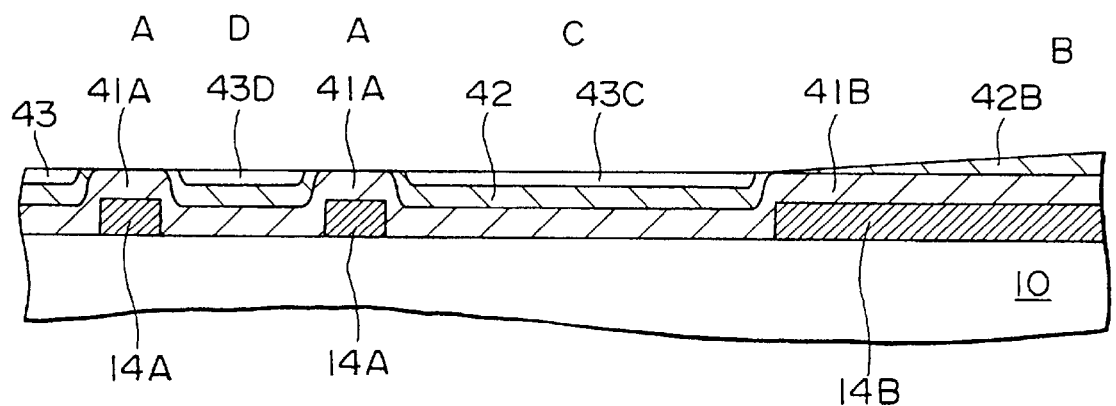
FIGS. 9A and 9B show a polishing sequence for the films formed in the fifth example.

As the polishing further proceeds, the third film 43B in the region B disappears by polishing, as shown in FIG. 9A. The second film 42B in the region B is polished to a greater extent. On the other hand, the surface of the first film 41A formed on the top of the interconnection 14A is exposed. At this time, since the surface of the first film 41A in the region A is approximately at the same level as that of the surfaces of the third film 43C over the wide bottom of the step portion (region C) and the third film 43D over the narrow bottom of the step portion (region D), the third film 43C in the region C, the third film 43D in the region D and the first film 41A in the region A function as polishing stoppers. As a result, polishing is stopped at the level equivalent to the surface height of the first film 41A, the third film 43C and the third film 43D. The surface height of each film in such a stage is plotted with respect to a time $t_B$ in FIG. 10.

Figure 9B:
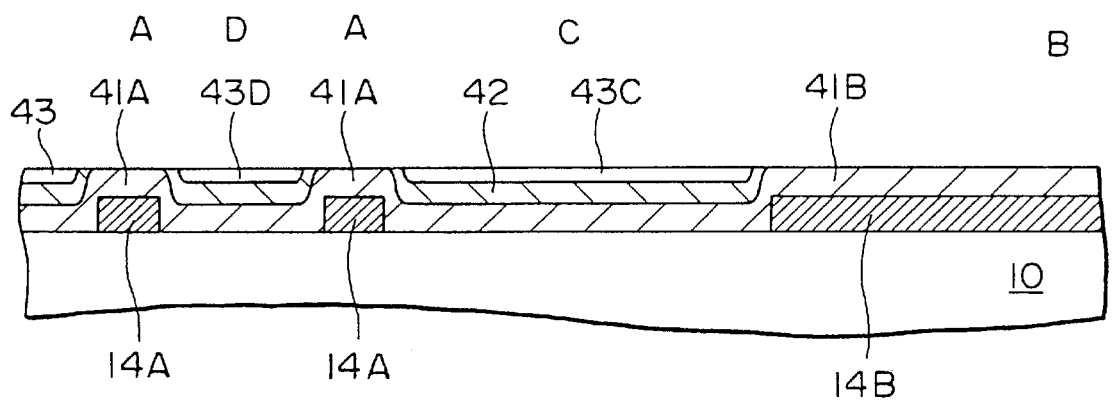

At this time, however, the second film 42B remains to a great degree over the wide width interconnection 14B (region B). Next, the remaining second film 42B (see FIG. 9A) is polished to be removed, as shown in FIG. 9B. In this polishing, since the first film 41A and the third films 43C, 43D polished approximately at the same height as that of the first film 41A function as the polishing stoppers, the second film 42 exposed between the interconnections 14 is little polished. Moreover, the first film 41B on the top of the wide width interconnection 14 (region B) functions as a polishing stopper, and accordingly the first film 41, the second film 42 and the third film 43 are approximately planarized. The surface height of each film in such a stage is plotted with respect to a time $t_B'$ in FIG. 10.

When the polishing proceeds until an elapse of a time $t_D$, the third film 43D in the region D disappears by polishing. Accordingly, a time allowance $t_M$ capable of controlling polishing can be set as a time interval between $t_B'$ to $t_D$. In addition, the time $t_B'$ is specified by the interconnection region having the maximum interconnection width; however, in general, the time $t_B'$ is made constant when the width of an interconnection is more than a specified value. On the other hand, the third film 43 in the region D disappears after an elapse of a specified time $(t_D)$ irrespective of the interconnection width by the polishing pressure component in the direction perpendicular to the surface of the base body 10. moreover, as the polishing proceeds until an elapse of a time $t_C$, the third film 43C in the region C disappears by polishing, and the second film 42 in the region C is polish ed in a recessed shape, with a result that the flatness is degraded. As described above, the polishing time is set at a value in a range of from $t_B'$ to $t_D$.

In the film planarization method in this example, the values $T_3$, H and $T_1$ preferably satisfy the relationship of $|T_3-(H+T_1)| \leq 0.1$ $\mu$m for ensuring a sufficient polishing allowance so as to approximately planarize the surfaces of the first, second and third films formed on the base body.

Modification of Example 5

Figure 11A:
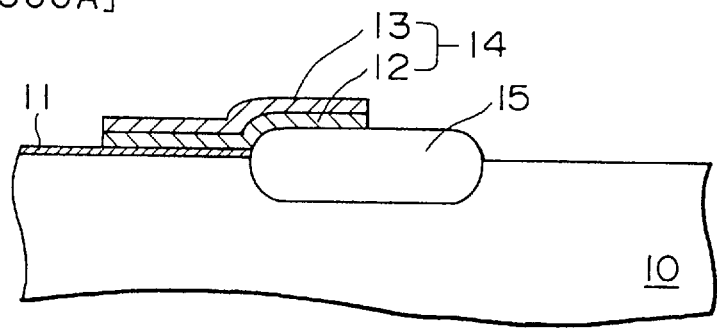
FIGS. 11A, 11B and 11C are typical views, partly in section, of step portions and films formed on a base body, showing a process sequence in a method of planarizing films in a semiconductor device according to a modification of the fifth example.

In this modification, a base body is formed of a semiconductor substrate, and a step portion is formed of an interconnection 14 formed on an element isolation region 15 having an LOCOS structure formed on the base body (see FIG. 11A). Namely, the step portion is composed of two-fold steps: the first step composed of the element isolation region 15 having an LOCOS structure and the second step composed of the interconnection 14.

Figure 11B:
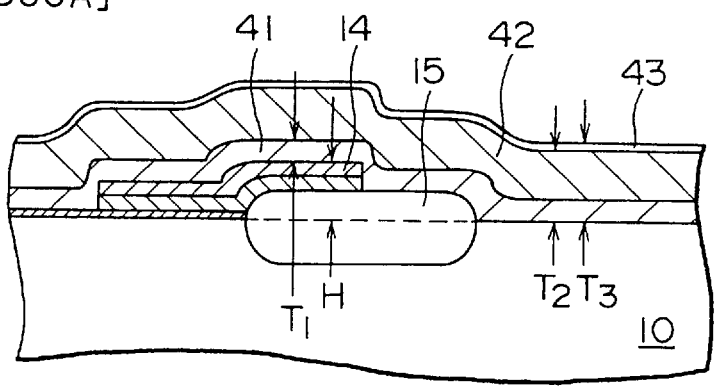
Figure 11C:
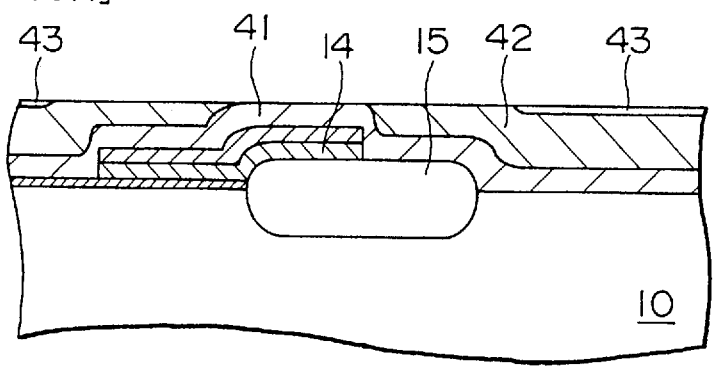

Like Example 5, a first film 41 is made of silicon oxide ($SiO_2$); a second film 42 is made of BPSG; and a third film 43 is made of silicon oxide ($SiO_2$). The third film 43 and the second film 42 are polished by the chemical-mechanical polishing process or the mechanical polishing process. This modification is the same as Example 5, except for the configuration of the step portion, and therefore, the detailed explanation thereof is omitted. FIGS. 11A to 11C are typical views, partly in section, of step portions and films formed on a base body, showing Step-500A (equivalent to Step-500 in Example 5), Step-530A (equivalent to Step-530 in Example 5) and Step-540A (equivalent to Step-540 in Example 5), respectively.

EXAMPLE 6

This example concerns the method of planarizing films of the second embodiment of the present invention, which is intended to planarize an insulating film formed between interconnections like Example 4. In this example, a base body is formed of a semiconductor substrate, and a step portion is composed of a recessed portion formed in the base body. A first film is made of silicon oxide ($SiO_2$) and silicon nitride ($Si_3N_4$); a second film is made of BPSG; and a third film is made of silicon oxide ($SiO_2$). The first film is formed not only on the top of the step portion but also on the sidewalls and bottom surface of the step portion. The third film and the second film are polished by the CMP process. The first film formed on the top of the step portion (surface of the base body) functions as a polishing stopper for improving the uniformity in polishing, and the first film formed on the bottom of the step portion (bottom of the recessed portion) functions to prevent the diffusion of impurities from the second film made of BPSG to the base body.

More specifically, Example 6 concerns the preferable third method of the second invention. Namely, in this example, the step of forming the first film (thickness at the top of the step portion: $T_1$) at least on the top of the step portion (height: H) provided on the base body includes a step of forming an oxide film and an upper layer film on the base body and then forming a step portion composed of a recessed portion on the base body, and forming an oxide film on the sidewalls and the bottom surface of the recessed portion as the step portion. The first film at the top of the step portion is composed of the oxide film and the upper layer film, and the first film on the bottom of the step portion is composed of the oxide film.

Hereinafter, the method of planarizing films in this example will be described with reference to FIGS. 12A to 12C and FIGS. 13A to 13C. FIGS. 12A to 12C and FIGS. 13A to 13C are typical views, partly in section, of step portions and films formed on a base body, showing a process sequence in the method of planarizing films according to the sixth example.
[Step-600]

A first film 41A is formed on the surface of the base body 10 in the same manner as that described in Step-400 of Example 4. Specifically, an oxide film ($SiO_2$) having a thickness of 10 nm is formed on the base body 10 composed of a silicon substrate. An upper layer film (thickness: 0.15 $\mu$m) made of silicon nitride ($Si_3N_4$) is then formed on the oxide film by CVD. Thus, the first film 41A is composed of the oxide film ($SiO_2$) and the upper layer film ($Si_3N_4$) (see FIG. 12A).
[Step-610]

The first film 41A and the base body 10 are selectively etched by photolithography and etching in the same manner as that described in Step-410 of Example 4, to form recessed portions 30 as the step portions in the base body 10. Next, each recessed portion 30 is oxidized by thermal oxidation, to form an oxide film ($SiO_2$) 41B having a thickness of 20 nm is formed on the bottom surface and the sidewalls of the recessed portion 30 (see FIG. 12B).

The first films 41A, 41B are thus formed. In addition, the first film 41A on the top of the step portion is composed of the oxide film and the upper layer film, and the first film 41B on the bottom of the step portion is composed of the oxide film. In this example, the first film 41A is formed not only on the top of the recessed portion 30 as the step portion (surface of the base body 10) formed in the base body 10 but also on the bottom of the step portion.

The height (depth) H of the recessed portion 30 as the step portion provided in the base body 10 is set at 0.25 $\mu$m. $T_1$ is 0.16 $\mu$m. Accordingly, the value (H+$T_1$) is 0.41 $\mu$m.
[Step-620]

Figure 12A:
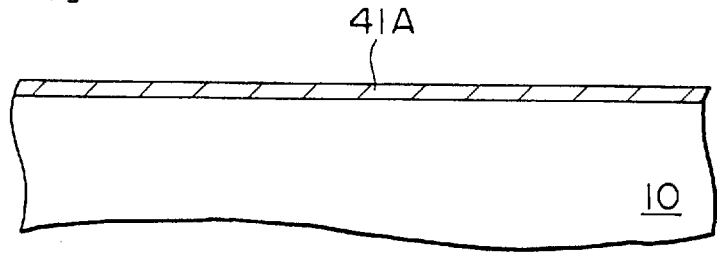
FIGS. 12A, 12B and 12C are typical views, partly in section, of step portions and films formed on a base body, showing a process sequence in a method of planarizing films in a semiconductor device according to a sixth example.
Figure 12B:
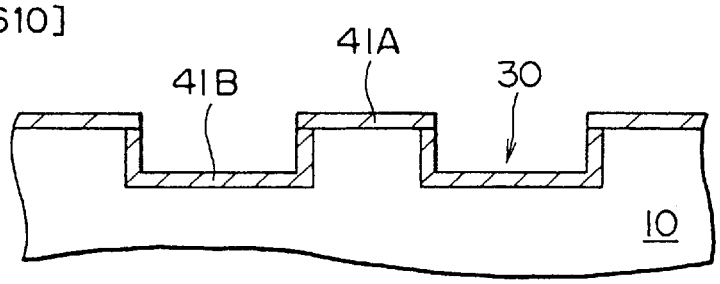
Figure 12C:
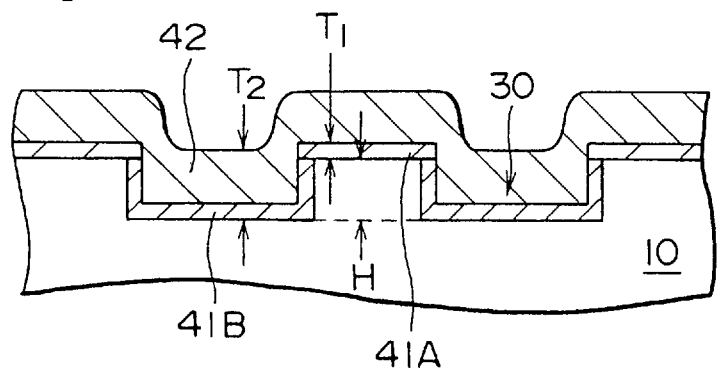

The step portion is then covered with a second film 42 higher in polishing rate than the first film 41A in such a manner that the thickness $T_2$ from the bottom surface of the step portion (bottom surface of the recessed portion 30) to the surface of the second film 42 is smaller than or approximately equal to the value (H+$T_1$) (see FIG. 12C). The second film 42 is made of BPSG in this example, which is formed by low pressure CVD as in Step-120 of Example 1. The thickness of the second film 42 at the bottom of the step portion (bottom of the recessed portion 30) is set at 0.30 $\mu$m. The thickness $T_2$ from the bottom surface of the step portion to the surface of the second film 42 becomes 0.32 $\mu$m (=0.02 $\mu$m+0.30 $\mu$m). As a result, the value $T_2$ (=0.32 $\mu$m) is smaller than the value (H+$T_1$) (0.41 $\mu$m=0.25 $\mu$m+0.16 $\mu$m). In addition, the second film 42 made of BPSG is not heat-treated after being deposited.
[Step-630]

Figure 13A:
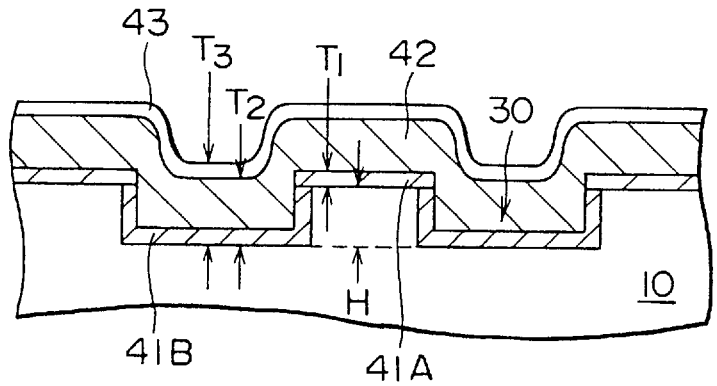
FIGS. 13A, 13B and 13C are typical views, partly in section, of step portions and films formed on a base body, which are continued to FIGS. 12A from 12C, showing a process sequence in the method of planarizing films in a semiconductor device according to the sixth example.
Figure 13B:
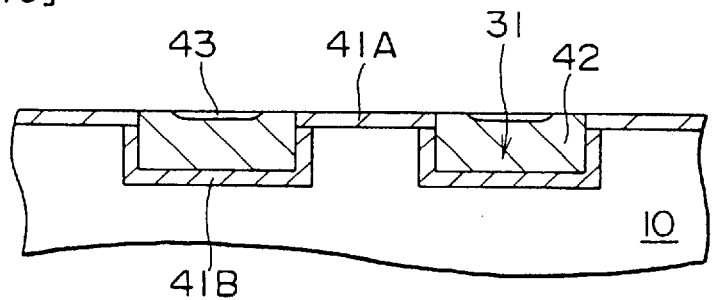

After that, a third film 43 (thickness: 0.10 $\mu$m) lower in polishing rate than the second film 42 is formed on the second film 42 in the same manner as that described in Step-530 of Example 5 (see FIG. 13A). The value $T_3$ is 0.42 $\mu$m. The thickness of the third film 43 satisfies the relationship of $|T_3-(H+T_1)|\leq0.1$ $\mu$m
[Step-640]

Next, the third film 43 and the second film 42 are polished in the same manner as that described in Step-540 of Example 5, to expose the first film 41A formed on the top of the recessed portion 30 as the step portion (surface of the base body 10) (see FIG. 13B).
[Step-650]

Figure 13C:
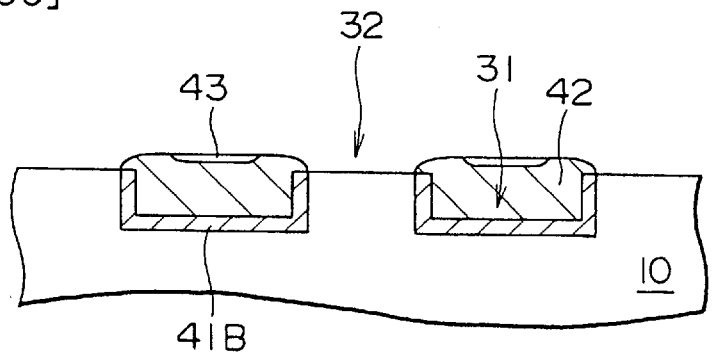

The first film 41A remaining on the surface of the base body 10 is removed in the same manner as that described in Step-430 of Example 4 (see FIG. 13C). Namely, silicon nitride ($Si_3N_4$) constituting the first film 41A is removed using phosphoric acid kept at 140° C., and silicon oxide ($SiO_2$) constituting the first film 41A is removed using 0.5% diluted hydrofluoric acid. In this way, as shown in FIG. 13C, the recessed portion 30 is buried with the second film 42 made of BPSG, and a trench type element isolation region 31 having an approximately smooth surface is formed. On the other hand, a semiconducting element forming region 32 is formed between the element isolation regions 31. In addition, the first film 41A remaining on the surface of the base body 10 may be removed by polishing.

The element isolation region 31 having a trench structure formed in this example includes a recessed portion 30 formed in the base body 10, the first film 41A formed on the bottom surface and the sidewalls of the recessed portion 30, and the second film buried in the recessed portion 30.

EXAMPLE 7

This example is another modification of Example 6, which concerns the first method of the second embodiment of the present invention. This example is different from Example 6 in formation of a first film 41. Specifically, the step of forming the first film (thickness at the top of a step portion: $T_1$) on at least the top of the step portion (height: H) provided on a base body includes a step of forming a step portion composed of a recessed portion 30 in the base body 10 and forming a first film 41 on the entire surface of the base body 10 including the recessed portion 30 as the step portion. Hereinafter, the method in this example will be described with reference to FIGS. 14A to 14C and FIGS. 15A, 15B. FIGS. 14A to 14C and FIGS. 15A, 15B are typical views, partly in section, of step portions and films formed on a base body, showing a process sequence in the method of planarizing films according to the seventh example. In addition, the first film functions as a polishing stopper for improving the uniformity in polishing and it also practically functions to prevent the diffusion of impurities from the second film made of BPSG to the base body.

[Step-700]

Recessed portions are formed in a base body 10 composed of a semiconductor substrate by photolithography and etching in the same manner as that described in Step-200 of Example 2. The recessed portion 30 constitutes a step portion. More specifically, the top of the step portion is equivalent to the surface of the base body 10; the bottom of the step portion is equivalent to the bottom of the recessed portion; and the bottom surface of the step portion is equivalent to the bottom surface of the recessed portion 30. The depth of the recessed portion 30, that is, the height H of the step portion is 0.30 $\mu$m. After that, the whole of the base body 10 including the interiors of the recessed portions 30 is oxidized. Thus, a first film 41 made of $SiO_2$ is formed (see FIG. 14A). The thickness $T_1$ of the first film 41 at the top of the step portion is set at 20 nm.

[Step-710]

The step portion is then covered with a second film 42 higher in polishing rate than the first film 41 in such a manner that the thickness $T_2$ from the bottom surface of the step portion (bottom surface of the recessed portion 30) to the surface of the second film 42 is smaller than or approximately equal to the value (H+$T_1$) (see FIG. 14B). The step may be the same as Step-620 in Example 6. The thickness of the second film 42 at the bottom of the step portion (bottom of the recessed portion 30) is set at 0.30 $\mu$m. Namely, the thickness $T_2$ from the bottom surface of the step portion to the surface of the second film 42 becomes 0.32 $\mu$m (=0.02 $\mu$m+0.30 $\mu$m). Accordingly, the value $T_2$ (=0.32 $\mu$m) is equal to the value (H+$T_1$) (0.32 $\mu$m=0.02 $\mu$m+0.30 $\mu$m). The second film 42 made of BPSG is not heat-treated after being deposited.

[Step-720]

After that, a third film 43 made of silicon oxide, which is lower in polishing rate than the second film, is formed on the second film 42 in the same manner as that described in Step-630 of Example 6 (see FIG. 14C). In addition, the value $T_3$ is about 0.42 $\mu$m as in Example 6.

[Step-730]

Figure 15A:
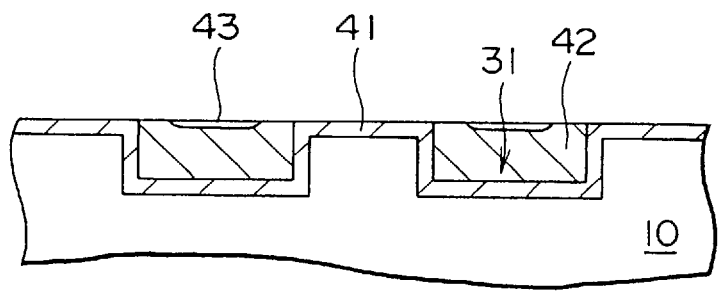
FIGS. 15A and 15B are typical views, partly in section, of step portions and films formed on a base body, which are continued from FIGS. 14A to 14C, showing a process sequence in the method of planarizing films in a semiconductor device according to the seventh example.
Figure 15B:
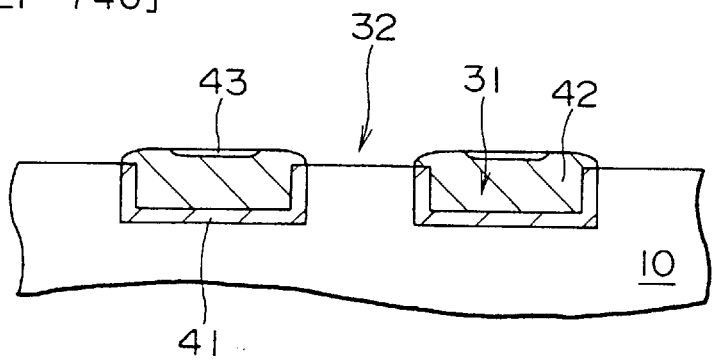

Next, the third film 43 and the second film 42 are polished in the same manner as that described in Step-540 of Example 5, to expose the first film 41 formed on the top of the recessed portion 30 as the step portion (surface of the base body 10) (see FIG. 15A).

[Step-740]

The first film 41 remaining on the surface of the base body 10 is then removed in the same manner as that described in Step-650 of Example 6. Thus, each element isolation region 31 having a trench structure is formed and a semiconducting element forming region 32 is formed between the element isolation regions 31.

EXAMPLE 8

This example is a modification of Example 6, which concerns the second embodiment of the present method of the second invention. This example is different from Example 6 in formation of a first film 41. Specifically, the step of forming the first film (thickness at the top of a step portion: $T_1$) on at least the top of the step portion (height: H) provided on a base body includes a step of forming a first film 41 on the base body 10 and forming a step portion composed of a recessed portion 30 in the base body 10. Hereinafter, the method in this example will be described with reference to FIGS. 16A to 16C and FIGS. 17A, 17B. FIGS. 16A to 16C and FIGS. 17A, 17B are typical views, partly in section, of step portions and films formed on a base body, showing a process sequence in the method of planarizing films according to the eighth example.

[Step-800]

A first film 41 is formed only on the surface of a base body 10, as in Example 6. Specifically, the first film 41 made of silicon oxide ($SiO_2$), silicon nitride ($Si_3N_4$) or the combination thereof is formed on the base body 10 by CVD. The first film 41 and the base body 10 are selectively etched by photolithography and etching, to form each step portion composed of a recessed portion 30 in the base body 10 (see FIG. 16A). The first film 41 is formed only on the surface of the base body 10. Namely, the first film 41 is formed only on the top of the step portion provided on the base body 10. The depth of the recessed portion 30, that is, the height H of the step portion is set at 0.30 $\mu$m. On the other hand, the thickness $T_1$ of the first film 41 at the top of the step portion (surface of the base body 10) is set at 20 nm.

[Step-810]

Figure 16A:
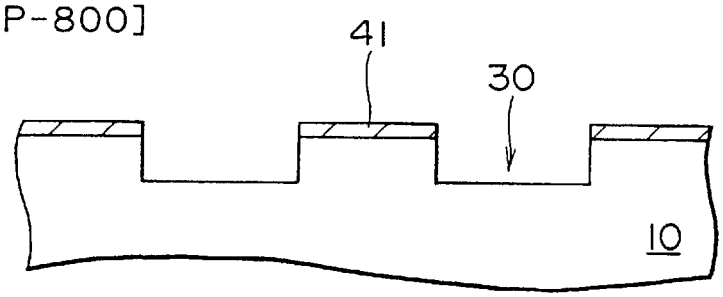
FIGS. 16A, 16B and 16C are typical views, partly in section, of step portions and films formed on a base body, showing a process sequence in a method of planarizing films in a semiconductor device according to an eighth example.
Figure 16B:
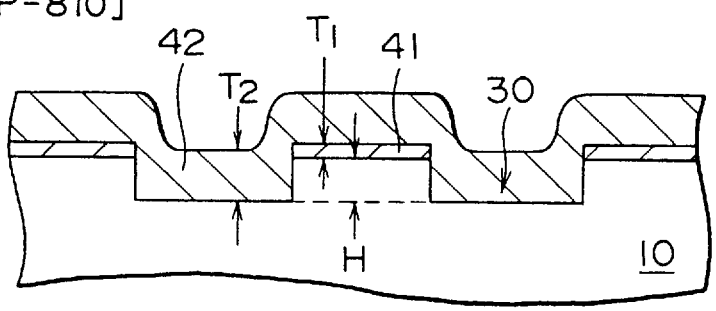

The step portion is then covered with a second film higher in polishing rate than the first film 41 in such a manner that the thickness $T_2$ from the bottom surface of the step portion (bottom surface of the recessed portion 30) is smaller than or approximately equal to the value (H+$T_1$) (see FIG. 16B). The step may be same as Step-620 in Example 6. The thickness of the second film 42 at the bottom of the step portion (bottom of the recessed portion 30) is set at 0.30 $\mu$m. Namely, the thickness $T_2$ from the bottom surface of the step portion to the surface of the second film 42 becomes 0.25 $\mu$m. Accordingly, the value $T_2$ (=0.27 $\mu$m) is smaller than the value (H+$T_1$) (0.32 $\mu$m=0.30 $\mu$m+0.02 $\mu$m). The second film 42 made of BPSG is not heat-treated after being deposited.

[Step-820]

Figure 16C:
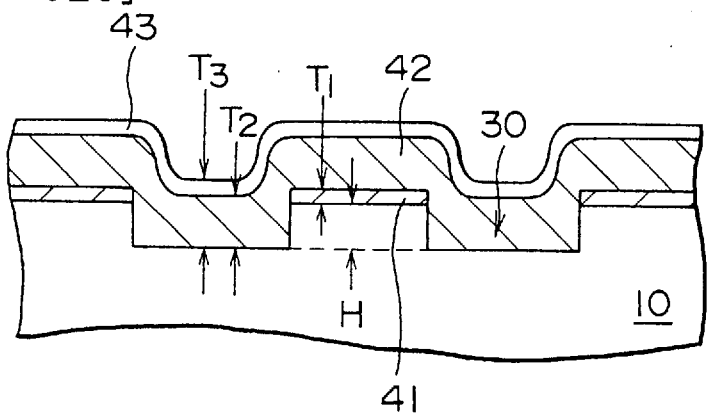

A third film 43 made of silicon oxide, which is lower in polishing rate than the second film 42, is formed on the second film 42 in the same manner as that described in Step-630 of Example 6 (see FIG. 16C).

[Step-830]

Figure 17A:
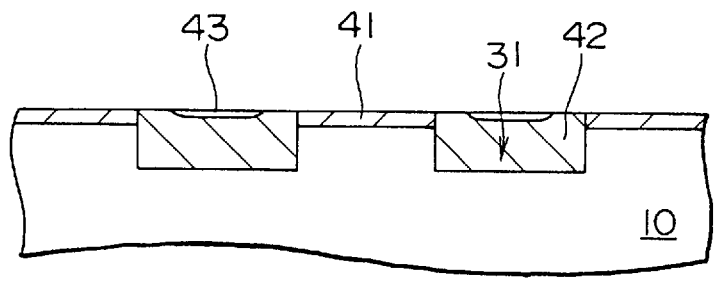
FIGS. 17A an 17B are typical views, partly in section, of step portions and films formed on a base body, which are continued from FIGS. 16A to 16C, showing a process sequence in the method of planarizing films in a semiconductor device according to the eighth example.
Figure 17B:
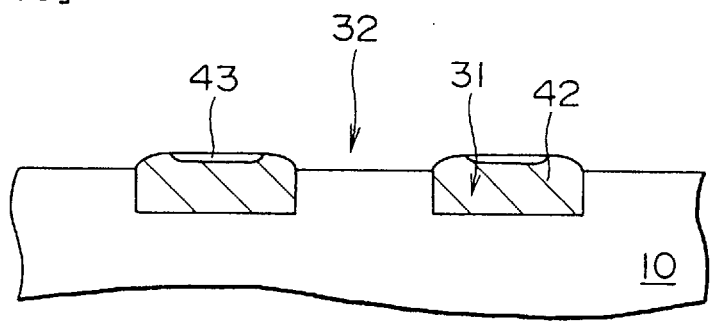

Next, the third film 43 and the second film 42 are polished in the same manner as that described in Step-540 of Example 5, to expose the first film 41 formed on the top of the recessed portion 30 as the step portion (surface of the base body 10) (see FIG. 17A).

[Step-840]

The first film 41 remaining on the surface of the base body 10 is removed as in Step-650 of Example 6. Thus, each element isolation region 31 having a trench structure is formed, and a semiconducting element forming region 32 is formed between the element isolation regions 31.

In the case where the second film 42 is made of BPSH, there occurs a problem that impurities are diffused from the second film 42 to the base body. To cope with such a problem, the second film 42 may be formed of two layers of polycrystalline silicon and BPSG.

EXAMPLE 9

Figure 18A:
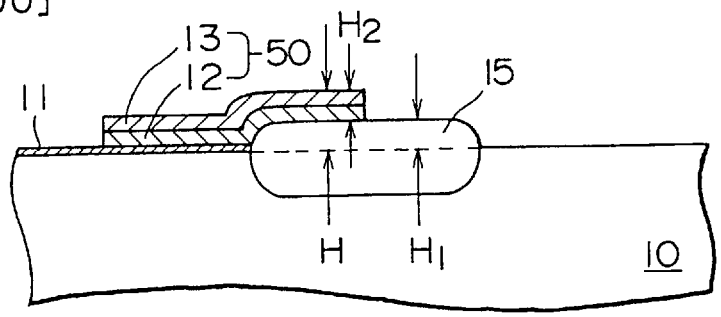
FIGS. 18A, 18B and 18C are typical views, partly in section, of step portions and films formed on a base body, showing a process sequence in a method of planarizing films in a semiconductor device according to a ninth example.

This example concerns a method of planarizing films of the third invention, which is intended to planarize an insulating film formed between interconnections, that is, an interlayer insulating film. In this example, a base body is composed of a semiconductor substrate, and a step portion is composed of an interconnection 50 formed on an element isolation region 15 having an LOCOS structure formed on the base body (see FIG. 18A). Specifically, the step portion is composed of two-fold steps (n=2): the first step composed of the element isolation region 15 having an LOCOS structure and the second step composed of the interconnection 50. In this example, four films (k=2; and the 2k-th film is the fourth film) are formed over the bottom of the step portion.

A (2m−1)-th film (m=1, 2, . . . , k, and k=n=2 in this example) is made of silicon oxide ($SiO_2$), and a 2m-th film is made of BPSG. The first film is formed not only on the top of the step portion but also on the sidewalls and bottom surface of the step portion. Each of the films from the 2m-th film to the second film is polished by CMP. In addition, the first film functions as a polishing stopper for improving the uniformity in polishing, and it also practically functions to prevent the diffusion of impurities from the second film made of BPSG to the base body.

In this example, the thickness $T_{2k}$ from the lowermost bottom surface of n-layer steps to the surface of the 2k-th film ($2 \leq k$) is set to be larger than the value ($H+T_1$), where H is the height from the lowermost bottom surface of the n-layer steps to the uppermost top of the n-layer steps, and $T_1$ is the thickness of the first film at the uppermost top of the n-layer steps.

In this example in which k=n=2, the thickness $T_{2j+1}$ from the lowermost bottom surface of the n-layer steps to the surface of the (2j+1)-th film (j=1, 2, . . . k−1, and $2 \leq k$) is approximately equal to the value of $$T_1 + \sum_{i=n-j+1}^{n} H_i$$

where $T_1$ is the thickness of the first film at the uppermost top of the n-layer steps and $H_i$ is the height of the i-th step (i=1, 2, . . . , n) from the lowermost bottom of the n-layer steps.

Hereinafter, the method of planarizing films in this example will be described with reference to FIGS. 18A to 18C and FIGS. 19A to 19C. FIGS. 18A to 18C and FIGS. 19A to 19C are typical views, partly in section, of step portions and films formed on a base body, showing a process sequence in the method of planarizing films according to the ninth example.

[Step-900]

An interconnection 50 is formed on each element isolation region 15 having an LOCOS structure in the same manner as that described in Step-100 of Example 1. The interconnection 15 on the element isolation region 15 is made of a polycrystalline silicon layer 12 (thickness: 0.10 μm) doped with phosphorus (P) and a tungsten silicide ($WSi_2$) layer 13 (thickness: 0.10 μm). The height H (=$H_1$+$H_2$) from the lowermost bottom surface of the n-layer steps to the uppermost top of the n-layer steps is 0.35 μm. Namely, the height ($H_1$) of the element isolation region 15 (first step) is 0.15 μm and the height ($H_2$) of the interconnection 50 (second step) is 0.2 μm.

[Step-910]

Figure 18B:
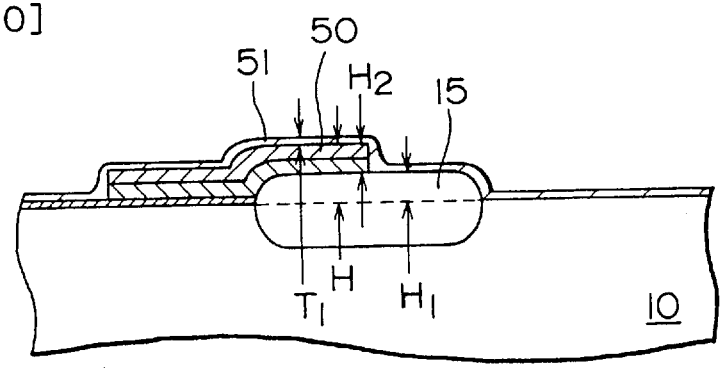

The n-layer steps (n≧2, and n=2 in this example) formed on the base body 10 are covered with a first film 51 in the same manner as that described in Step-510 of Example 5 (see FIG. 18B). The first film 51 is made of silicon oxide ($SiO_2$). The thickness of the first film 51 is set at 0.10 μm. Namely, the thickness of $T_1$ of the first film at the uppermost top of the n-layer steps is 0.10 μm.

[Step-920]

Next, a second film 52 higher in polishing rate than the first film 51 is formed on the first film 51, to cover the step portion with the second film 52. In this example, the second film 52 is made of BPSG, which is formed by low pressure CVD. The step may be the same as Step-520 of Example 5. The thickness of the second film 52 is set at 0.17 μm. Accordingly, the value $T_2$ is 0.27 μm (=0.10 μm+0.17 μm).

[Step-930]

Figure 18C:
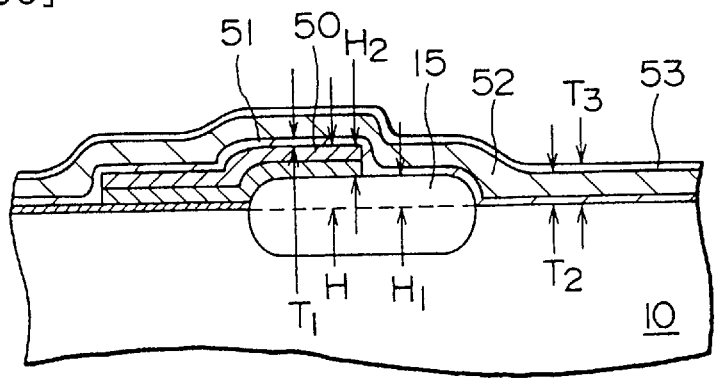

A third film 53 [(2m+1)-th film, where m=1) lower in polishing rate than the second film 52 is formed on the second film 52 (see FIG. 18C). The third film 53 is made of silicon oxide formed by plasma CVD using tetraethoxysilane (TEOS). The third film 53 may be made of silicon nitride ($Si_3N_4$). The thickness of the third film 53 is set at 30 nm. Accordingly, the thickness $T_3$ from the lowermost bottom surface of the n-layer steps to the surface of the (2m+1=3)-th film is 0.30 μm (=0.10 μm+0.17 μm+0.03 μm).

On the other hand, since n=2 and j=1 in this example, the value of the equation $$T_1 + \sum_{i=n-j+1}^{n} H_i$$

becomes 0.30 μm, which is equal to the value $T_3$.

In the method of planarizing films according to the third invention, Step-920 and Step-930 are repeated (k−1) times; however, in this example (k=2), these steps are carried out only one time.

[Step-940]

Figure 19A:
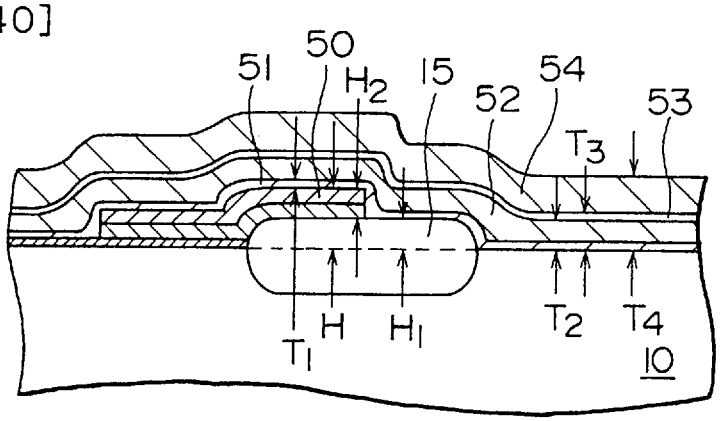
FIGS. 19A, 19B and 19C are typical views, partly in section, of step portions and films formed on a base body, which are continued to FIGS. 18A from 18C, showing a process sequence in the method of planarizing films in a semiconductor device according to the ninth example.

After that, a (2k=4)-th film 54 higher in polishing rate than the (2k−1=3)-th film 53 is formed on the (2k−1=3)-th film 53 (see FIG. 19A). The step may be the same as Step-920. The thickness of the fourth film 54 is set at 0.50 μm. The value ($H+T_1$) is 0.45 μm (=0.35 μm+0.10 μm). Moreover, the thickness $T_{2k(=4)}$ from the lowermost bottom surface of the n-layer steps to the surface of the (2k=4)-th film 54 is 0.80 μm (=0.10 μm+0.17 μm+0.03 μm+0.50 μm). Accordingly, the value $T_{2k}$ is larger than the value ($H+T_1$).

[Step-950]

Figure 19B:
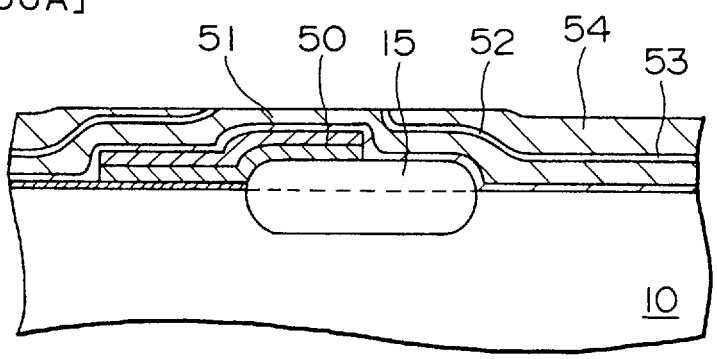
Figure 19C:
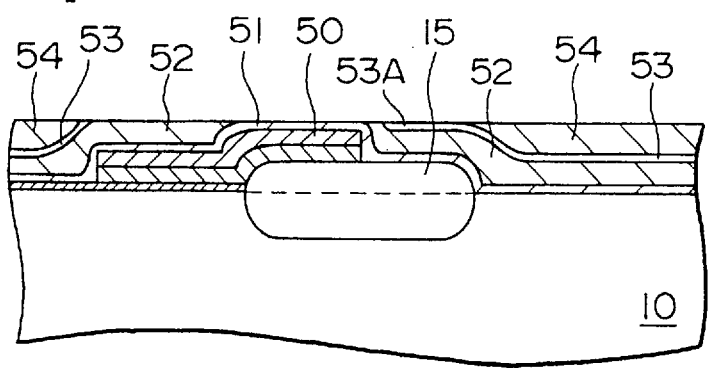

After that, the films from the (2k=4)-th film 54 to the second film 52 are polished, to exposed the first film formed on the uppermost top of the n-layer steps. The step may be the same as Step-540 of Example 5. The typical view, partly in section, of the step portions and films formed on the base body during polishing is shown in FIG. 19B, and the typical view thereof after completion of polishing is shown in FIG. 19C.

The height $H_1$ of the first step is 0.15 μm. On the other hand, the height ($H_1+T_3$) of the third film 53 formed over the first step on the basis of the surface of the base body 10 (lowermost bottom surface of the steps) is 0.45 μm (=0.15 μm+0.30 μm). Accordingly, the height of the third film 53 formed over the first step on the basis of the surface of the base body 10 (lowermost surface of the steps) is equal to the height of the surface of the first film at the uppermost top of the n-layer steps.

Consequently, when the films from the 2k-th film (fourth film 54 in this example) to the second film 52 are polished to expose the first film 51 formed on the uppermost top of the n-layer steps, the first film 51 formed on the top of the n-layer steps functions as a polishing stopper and also the (2m+1)-th film (third film 53A shown in FIG. 19C in this example) formed over the first step functions as a polishing stopper. Accordingly, it is possible to effectively suppress excessive polishing of the k-th film (fourth film 54) and the 2m-th film (second film 52).

The 2m-th film (m=1, 2, . . . , k, 2≦k) may be made of PSG, or the combination of BPSG (or PSG) and polycrystalline silicon. The (2m−1)-th film may be made of silicon nitride, or the combination of silicon oxide and silicon nitride.

In this way, the method in this example provides a multi-layer insulating film including 2k-layers stacked between n-layer steps and having a planarized surface. The first layer of the multi-layer insulating film covers the uppermost top of the n-layer steps. On the other hand, part of the surface of the multi-layer insulating film over the bottom of the steps is composed of the 2k-th layer. Also, the 2m'-th layer (m'=1, 2, . . . , k−1, and 2≦k) and the (2m'+1)-th layer are exposed between the first layer and the 2k-th layer in the insulating film covering the uppermost top of the n-layer steps. The 2m'-th layer is higher in polishing rate than the (2m'±1)-layer and the 2k-th layer is higher in polishing rate than the (2k−1)-th layer.

EXAMPLE 10

This example is a modification of Example 9, which concerns a method of planarizing films according to the third invention. This example is different from Example 9 in that a step of forming a (2k+1)-th film (fifth film 55 in this example) lower in polishing than a 2k-th film (fourth film 54 in this example) on the 2k-th film is inserted between Step-940 and Step-950 in Example 9; the films from the (2k+1)-th film (fifth film 55 in this example) to the second film are polished in Step-950 in Example 9; and the thickness of the 2k-th film (fourth film 54 in this example) is changed. The five films (2k+1=2 ×2+1) are formed over the bottom of the step portion. The fifth film 55 is made of silicon oxide (SiO$_2$).

In this example in which k=n=2, the thickness T$_{2j+1}$ from the lowermost bottom surface of the n-layer steps to the surface of the (2j+1)-th film (j=1, 2, . . . , k−1, and 2≦k) is approximately equal to the value of $$T_1 + \sum_{i=n-j+1}^{n} H_i$$

where T$_1$ is the thickness of the first film on the uppermost top of the n-layer steps and H$_1$ is the height of the i-th step (i=1, 2, . . . , n) from the lowermost bottom of the n-layer steps.

Figure 20A:
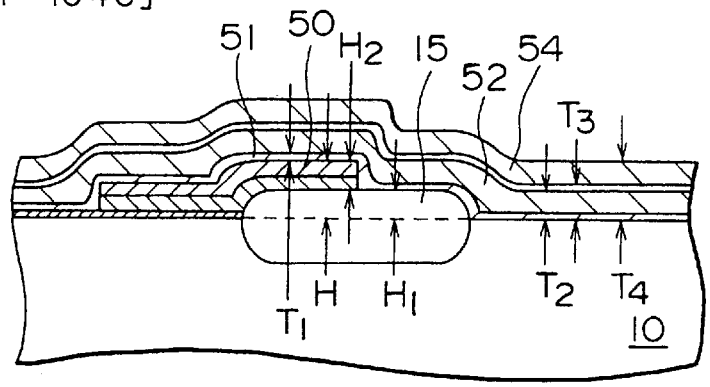
FIGS. 20A, 20B and 20C are typical views, partly in section, of step portions and films formed on a base body, showing a process sequence in a method of planarizing films in a semiconductor device according to a tenth example.
Figure 20B:
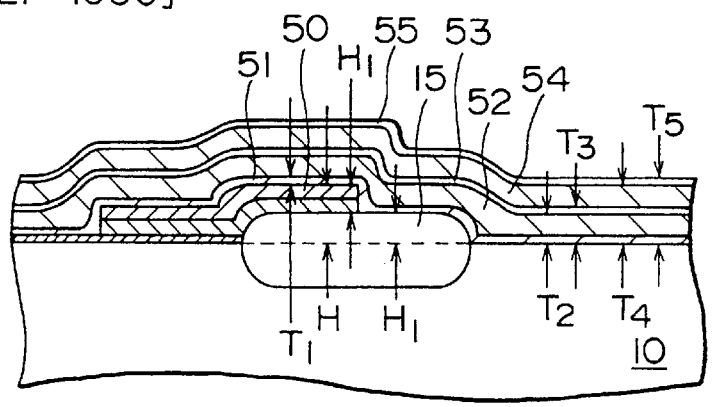
Figure 20C:
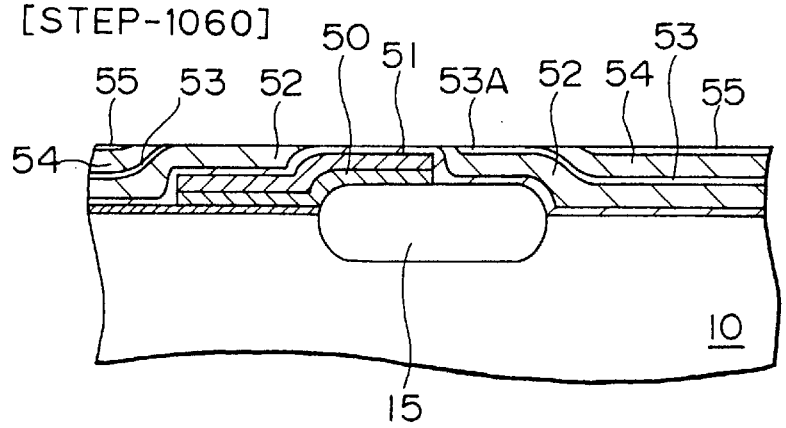

Hereinafter, the method of planarizing films in this example will be described with reference to FIGS. 20A to 20C. FIGS. 20A to 20C are typical views, partly in section, of step portions and films formed on a base body, showing a process sequence in the method of planarizing films according to the tenth example.

[Step-1000]

An interconnection 50 is formed on each element isolation region 15 having an LOCOS structure in the same manner as that described in Step-900 of Example 9. The height H$_1$ of the element isolation region 15 as the first step is 0.15 μm, and the height H$_2$ of the interconnection 50 as the second step is 0.20 μm. The height H (=H$_1$+H$_2$) from the lowermost bottom surface of the n-layer steps to the uppermost top of the n-layer steps is 0.35 μm.

[Step-1010]

The n-layer steps (n≧2, and n=2 in this example) formed on a base body 10 are covered with a first film 51 in the same manner as that described in Step-910 of Example 9. The first film 51 is made of silicon oxide (SiO$_2$). The thickness of the first film 51 is set at 0.10 μm. Namely, the thickness T$_1$ of the first film on the uppermost top of the n-layer steps is 0.10 μm.

[Step-1020]

A second film 52 made of BPSG, which is higher in polishing rate than the first film 51, is formed on the first film 51 in the same manner as that described in Step-920 of Example 9, to cover the steps with the second film 52. The thickness of the second film 52 is set at 0.17 μm. Accordingly, the value T$_2$ is 0.27 μm (=0.10 μm+0.17 μm).

[Step-1030]

A third film 53 [(2m+1)-th film, and m=1 in this example) made of silicon oxide (SiO$_2$), which is lower in polishing rate than the second film 52, is formed on the second film 52 in the same manner as that described in Step-930 of Example 9. The thickness of the third film 53 is set at 30 nm. Accordingly, the thickness T$_3$ from the lowermost bottom surface of the n-layer steps to the surface of the (2m+1=3)-th film 53 is 0.30 μm (=0.10 μm +0.17 μm+0.03 μm).

On the other hand, since n=2 and j=1 in this example, the value of $$T_1 + \sum_{i=n-j+1}^{n} H_i$$

is 0.30 μm, which is equal to the value T$_3$.

According to the present invention, Step-1020 and Step-1030 are repeated (k−1) times; however, in this example in which k=2, these steps are carried out only one time.

[Step-1040]

A (2k=4)-th film 54 higher in polishing rate than the (2k−1=3)-th film 53 is formed on the (2k−1=3)-th film 53 (see FIG. 20A). The step may be basically the same as Step-1020. The thickness of the fourth film 54 is set at 0.12 μm. The value (H+T$_1$) is 0.45 μm (=0.35 μm+0.10 μm). Moreover, the thickness T$_{2k=4}$ from the lowermost bottom surface of the n-layer steps to the surface of the (2k=4)-th film 54 is 0.42 μm (=0.10 μm+0.17 μm+0.03 μm+0.12 μm). Accordingly, the value of T$_{2k}$ is smaller than the value (H+T$_1$).

[Step-1050]

A (2k+1=5)-th film 55 lower in polishing rate than the (2k=4)-th film 54 is then formed on the (2k=4)-th film 54 (see FIG. 20B). The fifth film 55 is made of silicon oxide by plasma CVD using tetraethoxysilane (TEOS). In addition, the fifth film 55 may be made of silicon nitride (Si$_3$N$_4$). The thickness of the fifth film 55 is set at 30 nm. Accordingly, the thickness T$_5$ from the lowermost bottom surface of the n-layer steps to the surface of the (2k+1=5)-th film 55 is 0.45 μm (=0.10 μm+0.17 μm+0.03 μm+0.12 μm+0.03 μm).

The thickness T$_{2k+1}$ from the lowermost bottom surface of the n-layer steps to the surface of the (2k+1=5)-th film 55 is equal to the value (H+T$_1$) where H is the height from the lowermost bottom surface of the n-layer steps. The values T$_{2k+1}$, H, and T$_1$ in this example satisfy the relationship of |T$_{2k+1}$−(H+T$_1$)|≦0.1 μm.

[Step-1060]

After that, the films from the (2k+1=5)-th film 55 to the second film 52 are polished, to expose the first film formed on the uppermost top of the n-layer steps. The step may be the same as Step-540 in Example 5. The typical view, partly in section, of the step portions and films formed on the base body after completion of polishing is shown in FIG. 20C.

The height H$_1$ of the first step is 0.15 μm. On the other hand, the height (H$_1$30 T$_3$) of the third film 53 formed on the first step on the basis of the surface of the base body 10 (lowermost bottom surface of the steps) is 0.45 μm (=0.15 μm+0.30 μm). Accordingly, the height of the fifth film 55 formed over the bottom of the steps, the height of the third film 53 formed over the first step, and the height of the surface of the first film at the uppermost top of the n-folded steps are equal to each other on the basis of the surface of the base body 10 (lowermost bottom surface of the steps).

Consequently, when the films from the (2k+1)-th film to the second film 52 are polished to expose the first film 51 formed on the uppermost top of the n-layer steps, the first film 51 formed on the uppermost top of the n-layer steps and the fifth film 55 formed over the bottom of the steps function as polishing stoppers and also the third film 53 formed over the first step functions as a polishing stopper. Accordingly, it is possible to effectively suppress excessive polishing of the fourth film 54 and the second film 52.

The (2m'−1)-th film (m'=1, 2, . . . , k+1, 2≦k) may be made of silicon nitride, or the combination of silicon oxide and silicon nitride, and the 2m-th film (m'=1, 2, . . . , k, 2≦k) may be made of PSG, or the combination of BPSG (or PSG) and polycrystalline silicon.

In this way, the method in this example provides a multi-layer insulating film including (2k+1)-layers stacked between n-layer steps and having a planarized surface. The first layer of the multi-layer insulating film covers the uppermost top of the n-layer steps. On the other hand, part of the surface of the multi-layer insulating film over the bottom of the steps is composed of the (2k+1)-th layer. The 2m-th layer (m=1, 2, . . . , k, and 2≦k) and the (2m+1)-th layer (m=1, 2, . . . , k−1, and 2≦k) are exposed between the first layer and the (2k+1)-th layer in the insulating film covering the uppermost top of the n-layer steps. The 2m-th layer is higher in polishing rate than the (2m±1)-layer and the (2k+1)-th layer is higher in polishing rate than the 2k-th layer.

EXAMPLE 11

This example is a modification of Example 10, which is different from Example 10 in terms of thickness of the 2m-th film (m=1, 2, . . . , k, 2≦k).

Namely, in Example 10 in which k=n=2, the thickness $T_{2j+1}$ from the uppermost bottom surface of the n-layer steps to the surface of the (2j+1)-th film (j=1, 2, . . . , k−1, 2≦k) is approximately equal to the value of $$T_1 + \sum_{i=n-j+1}^{n} H_i$$

where $T_1$ is the thickness of the first film at the uppermost top of the n-layer steps and $H_i$ is the height of the i-th step (i=1, 2, . . . , n) from the lowermost bottom of the n-fold step.

On the other hand, in this example in which k=n=2, the thickness $T_{2j+1}$ from the uppermost bottom surface of the n-layer steps to the surface of the (2j+1)-th film (j=1, 2, . . , k−1, 2≦k) is approximately equal to the value ($T_1+H_i$) where $T_1$ is the thickness of the first film at the uppermost top of the n-layer steps and $H_i$ is the height of the i-th step (i=1, 2, . . . , n) from the lowermost bottom of the n-fold step.

The thicknesses of films from the first film 51 to the fifth film 55 are as follows:

first film 51: 0.10 μm second film 52: 0.12 μtm third film 53: 0.03 μm fourth film 54: 0.17 μm fifth film 55: 0.03 μm Each step in the method in this example may be the same as that in Example 10, and the detailed explanation thereof is omitted.

In this example, when the films from the (2k+1)-th film to the second film are polished to expose the first film formed on the uppermost top of the n-layer steps, the first film 51 formed on the uppermost top of the n-layer steps and the fifth film formed over the bottom of the steps function as polishing stoppers and also the third film 53 formed over the first film functions as a polishing stopper. Accordingly, it is possible to more effectively suppress excessive polishing of the fourth film 54 and the second film 52.

While the present invention has been described with reference to the preferred examples, such description is for illustrative purposes only, and it is to be understood that the specific values and conditions used in each example may be changed. For example, the step portion may be composed of any element other than an interconnection and an element isolation region.

In the examples, the interconnection 14 or 50 is taken as a gate electrode of an MOS transistor or the extension of the gate electrode; however, it may be composed of the other element. The base body 10 is not limited to a silicon substrate. For example, it may be composed of a compound semiconductor substrate such as GaAs. The base body 10 may be also composed of a trench type element isolation region formed on a silicon substrate and the interconnection 14 may be formed on the trench type element isolation region.

In examples of the first and second embodiments of the present invention, the folded number of steps is taken as one or two; however, it may be three or more. In the example of the third invention, while the folded number of steps is taken as two, it may be three or more; and while the value k or n is set at 2, the value n may be one or more and the value k may be two or more. The value k may be less than or more than the value n. The selection of the first, second and third embodiments of the present invention for planarizing films may be determined on the basis of the shape and height of a step portion and an interval between step portions.

In the method of planarizing films in a semiconductor device according to the present invention, a high polishing rate and a reduction in film stress with time can be simultaneously obtained using a second film or a 2m-th film containing phosphorus in an amount of from 6 to 9 wt %. This is effective to lower the fabrication cost due to shortening of a polishing time and to improve reliability. Since the second film or the 2m-th film is higher in polishing rate than a first film containing no phosphorus, it is possible to improve a process margin and a flatness and to shorten a polishing time while keeping high reliability using the first film containing no phosphorus as a polishing stopper.

In the method of planarizing films according to the present invention, a first film and a second film higher in polishing rate than the first film are stacked or a film lower in polishing rate and a film higher in polishing rate are stacked, and are then polished for planarization, so that the first film or the film lower in polishing rate formed at the top of a step portion functions as a polishing stopper. As a result, the polishing for the second film or the film higher in polishing rate can be controlled by the first film or the film lower in polishing rate, so that it is possible to effectively suppress the occurrence of local irregularities on the polished film of a base body, and hence to realize film planarization by polishing while keeping the uniformity in polishing. Since the first film or the film lower in polishing rate is used as a polishing stopper, it is possible to improve controllability in film thickness. Even when each film is excessively polished, it can keep a specified thickness, so that the uniformity in polishing within a wafer surface can be improved.

Thus, the present invention is advantageous in increasing a margin of a focal depth upon exposure in photolithography, and in reducing an over-etch amount upon formation of a connection hole thereby improving reliability for interconnections. In the case of planarization of trench type element isolation regions by polishing, it is possible to prevent occurrence of damages to a base body while making smooth the surface of the base body and the element isolation regions, and hence to eliminate a reduction in film thickness (dishing) even in a wide element isolation region. The present invention, therefore, is effective to improve a fabrication yield of semiconductor devices and to easily fabricate semiconductor devices on a large scale.

In the method of planarizing films according to the first or second invention, a sufficient polishing allowance can be ensured by setting a height difference between the surface of a third film or a (2k+1)-th film formed over the bottom of a step portion and the surface of a first film formed on the top of the step portion to be within a range of ±0.1 μm. Thus, it is possible to polish the surface of each film substantially at the same level.

The present invention also makes it possible to obtain a sufficient polishing rate ratio for each film by suitably selecting the material for each of a 2m-th film and a (2m±1)-th film.

What is claimed is:

1. A method of planarizing films in a semiconductor device, comprising the steps of:

forming a first, silicon-containing film on at least the top of a step portion provided on a base body;

covering said step portion with a second, glass film containing phosphorus in an amount of from 6 to 9 wt % and being higher in polishing rate than said first film; and (c) polishing said second film to expose said first film formed on the top of said step portion.

2. A method of planarizing films in a semiconductor device according to claim 1, wherein said step (b) is followed by said step (c) without heat treatment for said second film.

3. A method of planarizing films in a semiconductor device according to claim 2, wherein said first film comprises either a silicon oxide film or a silicon nitride film, or a stacked film having a silicon oxide layer and a silicon nitride layer; and said second film comprises a borophosphosilicate glass film or a phosphosilicate glass film.

4. A method of planarizing films in a semiconductor device according to claim 3, wherein a thickness $T_2$ from the bottom surface of said step portion to the surface of said second film is larger or approximately equal to a value $(H+T_1)$ where H is a height of said step portion and $T_1$ is a thickness of said first film at the top of said step portion.

5. A method of planarizing films in a semiconductor device according to claim 3, further comprising a step of removing said first film on the top of said step portion, which is inserted after said step (c).

6. A method of planarizing films in a semiconductor device, comprising the steps of:

(a) forming a first silicon-containing film on at least the top of a step portion provided on a base body, said first film having a thickness of $T_1$ at the top of said step portion and said step portion having a thickness of H;

(b) covering said step portion with a second, glass film in such a manner that a thickness $T_2$ from the bottom surface of said step portion to the surface of said second film is smaller or approximately equal to a value $(H+T_1)$, said second film containing phosphorus in an amount of from 6 to 9 wt % and being higher in polishing rate than said first film;

(c) forming a third film being lower in polishing rate than said second film on said second film in such a manner that a thickness from the bottom surface of said step portion to the surface of said third film is specified at a value $T_3$; and (d) polishing said third film and said second film for exposing said first film formed on the top of said step portion.

7. A method of planarizing films in a semiconductor device according to claim 6, wherein said step (b) is followed by said step (c) without heat treatment for said second film.

8. A method of planarizing films in a semiconductor device according to claim 7, wherein said first film comprises either a silicon oxide film or a silicon nitride film, or a stacked film having a silicon oxide layer and a silicon nitride layer; said second film comprises a borophosphosilicate glass film or a phosphosilicate glass film; and said third film comprises either a silicon oxide film or a silicon nitride film, or a stacked film having a silicon oxide layer and a silicon nitride layer.

9. A method of planarizing films in a semiconductor device according to claim 8, wherein said values $T_3$, H and $T_1$ satisfy a relationship of $|T_3-(H+T_1)|\leq 0.1$ μm.

10. A method of planarizing films in a semiconductor device according to claim 8, further comprising a step of removing said first film on the top of said step portion, which is inserted after said step (d).

11. A method of planarizing films in a semiconductor device according to claim 8, wherein said step (a) comprises a step of forming a step portion composed of a recessed portion in said base body and then forming said first film over the entire surface of said base body including the bottom portion of said recessed portion as said step portion.

12. A method of planarizing films in a semiconductor device according to claim 8, wherein said step (a) comprises a step of forming said first film on said base body and then forming a step portion composed of a recessed portion in said base body.

13. A method of planarizing films in a semiconductor device according to claim 7, wherein said step (a) comprises a step of forming an oxide film and an upper layer film on said base body, forming a step portion composed of a recessed portion in said base body, and forming an oxide film on the sidewalls and the bottom surface of said recessed portion as said step portion; and said first film on the top of said step portion is composed of said oxide film and said upper layer film, and said first film on the bottom portion of said step portion is composed of said oxide film.

14. A method of planarizing films in a semiconductor device according to claim 13, wherein said upper layer film constituting said first film comprises a silicon nitride film, and said oxide film constituting said first film comprises a silicon oxide film; said second film comprises a borophosphosilicate glass film or a phosphosilicate glass film; and said third film comprises either a silicon oxide film or a silicon nitride film, or a stacked film having a silicon oxide layer and a silicon nitride layer.

15. A method of planarizing films in a semiconductor device, comprising the steps of:

(a) covering n-layer steps (n≧2) formed on a base body with a first silicon-containing film;

(b) repeating (k−1) times a process of forming a glass 2m-th film (m=1, 2, . . . , k, and 2≦k) containing phosphorus in an amount of 6 to 9 wt % and being higher in polishing rate than a (2m−1)-th film on said (2m−1)-th film, and forming a (2m+1)-th film being lower in polishing rate than said 2m-th film on said 2m-th film;

(c) forming a 2k-th film containing phosphorus in an amount of 6 to 9 wt % and being higher in polishing rate than a (2k−1)-th film on said (2k−1)-th film; and (d) polishing films from said 2k-th film to said second film to expose said first film formed on the uppermost top of said n-layer steps.

16. A method of planarizing films in a semiconductor device according to claim 15, wherein said (2m+1)-th film is formed after formation of said 2m-th film without heat treatment for said 2m-th film in said step (b); and said step (c) is followed by said step (d) without heat treatment for said 2k-th film.

17. A method of planarizing films in a semiconductor device according to claim 16, wherein said 2m-th film (m=1, 2, ..., k, and 2≦k) comprises a borophosphosilicate glass film or a phosphosilicate glass film; and said (2m−1)-th film comprises either a silicon oxide film or a silicon nitride film, or a stacked film having a silicon oxide layer and a silicon nitride layer.

18. A method of planarizing films in a semiconductor device according to claim 17, wherein a thickness $T_{2k}$ from the lowermost bottom surface of said n-layer steps to the surface of said 2k-th film (2≦k) is larger than or approximately equal to a value (H+$T_1$) wherein H is a height from the lowermost bottom surface of said n-layer steps to the uppermost top of said n-layer steps and $T_1$ is a thickness of said first film at the uppermost top of said n-layer steps.

19. A method of planarizing films in a semiconductor device according to claim 18, wherein k=n, and a thickness $T_{2j+1}$ from the lowermost bottom surface of said n-layer steps to the surface of a (2j+1)-th film (j=1, 2, ..., k−1, and 2≦k) is approximately equal to a value given by $$T_1 + \sum_{i=n-j+1}^{n} H_i$$

where $T_1$ is a thickness of said first film at the uppermost top of said n-layer steps and $H_1$ is a height of an i-th step (i=1, 2, ..., n) from the lowermost bottom portion of said n-layer steps.

20. A method of planarizing films in a semiconductor device according to claim 16, wherein a step of forming a (2k+1)-th film being lower in polishing rate than said 2k-th film on said 2k-th film is inserted between said steps (c) and (d), and films from said (2k+1)-th film to said second film are polished in said step (d).

21. A method of planarizing films in a semiconductor device according to claim 20, wherein a (2m′−1)-th film (m′=1, 2, ..., k+1, and 2≦k) comprises either a silicon oxide film or a silicon nitride film, or a stacked film having a silicon oxide layer and a silicon nitride layer; and said 2m-th film (m=1, 2, ..., k, and 2≦k) comprises a borophosphosilicate glass film or a phosphosilicate glass film.

22. A method of planarizing films in a semiconductor device according to claim 21, wherein said values $T_{2K+1}$, H and $T_1$ satisfy a relationship of $|T_2k+1-(H+T_1)|≦0.1$ μm where $T_{2k+1}$ is thickness from the lowermost bottom surface of said n-layer steps to the surface of said (2k+1)-th film, H is a height from the lowermost bottom surface of said n-layer steps to the uppermost top of said n-layer steps and $T_1$ is a thickness of said first film at the uppermost top of said n-layer steps.

23. A method of planarizing films in a semiconductor device according to claim 21, wherein k=n, and a thickness $T_{2j+1}$ from the lowermost bottom surface of said n-layer steps to the surface of a (2j+1)-th film (j=1, 2, ..., k−1, and 2≦k) is approximately equal to a value given by $$T_1 + \sum_{i=n-j+1}^{n} H_i$$

where $T_1$ is a thickness of said first film at the uppermost top of said n-layer steps and $H_1$ is a height of an i-th step (i=1, 2, ..., n) from the lowermost bottom portion of said n-layer steps.

* * * * *

UNITED STATES PATENT AND TRADEMARK OFFICE
CERTIFICATE OF CORRECTION

PATENT NO.   : 5,824,360
DATED        : October 20, 1998
INVENTOR(S)  : Naoki NAGASHIMA It is certified that error appears in the above-identified patent and that said Letters Patent is hereby corrected as shown below:

Claim 1 should read:

1. A method of planarizing films in a semiconductor device, comprising the steps of:

(a) forming a first, silicon-containing film on at least the top of a step portion provided on a base body;

(b) covering said step portion with a second, glass film containing phosphorus in an amount of from 6 to 9 wt % and being higher in polishing rate than said first film; and (c) polishing said second film to expose said first film formed on the top of said step portion.

Signed and Sealed this

Sixth Day of July, 1999

*Attest:*

Q. TODD DICKINSON

*Attesting Officer*   *Acting Commissioner of Patents and Trademarks*